(12) United States Patent
Simon et al.

(10) Patent No.: US 11,515,428 B2
(45) Date of Patent: Nov. 29, 2022

(54) SEMICONDUCTOR DEVICE STRUCTURE HAVING MULTIPLE GATE TERMINALS

(71) Applicant: NaMLab gGmbH, Dresden (DE)

(72) Inventors: Maik Simon, Dresden (DE); Jens Trommer, Dresden (DE); Walter Weber, Vienna (AT); Stefan Slesazeck, Arnsdorf (DE)

(73) Assignee: NaMLab gGmbH, Dresden (DE)

( * ) Notice: Subject to any disclaimer, the term of this patent is extended or adjusted under 35 U.S.C. 154(b) by 69 days.

(21) Appl. No.: 17/132,264

(22) Filed: Dec. 23, 2020

(65) Prior Publication Data
US 2021/0202752 A1 Jul. 1, 2021

(51) Int. Cl.
| H01L 29/786 | (2006.01) |
| H01L 29/417 | (2006.01) |
| H01L 29/47 | (2006.01) |
| H01L 29/66 | (2006.01) |
| H01L 29/40 | (2006.01) |
| H01L 29/45 | (2006.01) |
| H01L 29/49 | (2006.01) |

(52) U.S. Cl.
CPC ...... *H01L 29/78645* (2013.01); *H01L 29/401* (2013.01); *H01L 29/41733* (2013.01); *H01L 29/458* (2013.01); *H01L 29/47* (2013.01); *H01L 29/66772* (2013.01); *H01L 29/78618* (2013.01); *H01L 29/78696* (2013.01); *H01L 29/4908* (2013.01)

(58) Field of Classification Search
CPC ............. H01L 29/78645; H01L 29/401; H01L 29/41733; H01L 29/458; H01L 29/47; H01L 29/66772; H01L 29/78618; H01L 29/78696; H01L 29/4908; H01L 27/1222; H01L 27/0207; H01L 29/66477; H01L 29/78
USPC ....................................................... 257/365
See application file for complete search history.

(56) References Cited

U.S. PATENT DOCUMENTS

| 9,917,103 B1* | 3/2018 | Mulfinger ........... H01L 27/1203 |
| 10,347,760 B2 | 7/2019 | Baldauf et al. |
| 2010/0301403 A1 | 12/2010 | Min et al. |
| 2012/0012933 A1* | 1/2012 | Cheng ................... H01L 29/665 257/347 |
| 2014/0239346 A1 | 8/2014 | Green et al. |
| 2016/0056301 A1* | 2/2016 | Lee .................... H01L 29/42352 257/295 |
| 2016/0181358 A1 | 6/2016 | Zhang et al. |
| 2018/0012996 A1* | 1/2018 | Baldauf ................. B82Y 40/00 |

* cited by examiner

*Primary Examiner* — Tong-Ho Kim
(74) *Attorney, Agent, or Firm* — Dicke, Billig & Czaja, PLLC

(57) ABSTRACT

One example provides an integrated circuit comprising a transistor including a semiconductor channel. The semiconductor channel includes three or more sub-channels, one or more nodes, each node being a junction of at least three sub-channels, and channel ends. A Schottky contact at each channel end forms a source or drain contact, and a gate contact disposed at each Schottky contact controls a barrier conductivity of the corresponding Schottky contact.

14 Claims, 35 Drawing Sheets

| P1a | P1b | A | B | OUT |
|---|---|---|---|---|
| 0 | 0 | 0 | 0 | 1 |
| 0 | 0 | 0 | 1 | 1 |
| 0 | 0 | 1 | 0 | 1 |
| 0 | 1 | 1 | 1 | Z |
| 0 | 1 | 0 | 0 | 1 |
| 0 | 1 | 0 | 1 | 1 |
| 0 | 1 | 1 | 0 | Z |
| 1 | 0 | 0 | 1 | Z |
| 1 | 0 | 1 | 0 | 1 |
| 1 | 0 | 1 | 1 | Z |
| 1 | 1 | 0 | 0 | 1 |
| 1 | 1 | 0 | 1 | Z |
| 1 | 1 | 1 | 0 | Z |
| 1 | 1 | 1 | 1 | Z |

Fig. 4b

| P1 | A | OUT1 |
|----|---|------|
| 0  | 0 | 1    |
| 0  | 1 | Z    |
| 1  | 0 | Z    |
| 1  | 1 | Z    |

| P1 | B | OUT2 |
|----|---|------|
| 0  | 0 | 1    |
| 0  | 1 | Z    |
| 1  | 0 | Z    |
| 1  | 1 | Z    |

Fig. 5b

| A | B | C | D | OUT (P1=0) | OUT (P1=1) |
|---|---|---|---|---|---|
| 0 | 0 | 0 | 0 | 1 | Z |
| 0 | 0 | 0 | 1 | 1 | Z |
| 0 | 0 | 1 | 0 | 1 | Z |
| 0 | 0 | 1 | 1 | Z | Z |
| 0 | 1 | 0 | 0 | 1 | Z |
| 0 | 1 | 0 | 1 | 1 | Z |
| 0 | 1 | 1 | 0 | Z | Z |
| 0 | 1 | 1 | 1 | 1 | Z |
| 1 | 0 | 0 | 0 | 1 | Z |
| 1 | 0 | 0 | 1 | Z | Z |
| 1 | 0 | 1 | 0 | 1 | Z |
| 1 | 0 | 1 | 1 | 1 | Z |
| 1 | 1 | 0 | 0 | Z | Z |
| 1 | 1 | 0 | 1 | Z | Z |
| 1 | 1 | 1 | 0 | Z | Z |
| 1 | 1 | 1 | 1 | Z | Z |

Fig. 6b

| A AND D | B AND E | C AND F | OUT (P1=0) | OUT (P1=1) |
|---|---|---|---|---|
| 0 | 0 | 0 | 1 | Z |
| 0 | 0 | 1 | 1 | Z |
| 0 | 1 | 0 | 1 | Z |
| 0 | 1 | 1 | 1 | Z |
| 1 | 0 | 0 | 1 | Z |
| 1 | 0 | 1 | 1 | Z |
| 1 | 1 | 0 | 1 | Z |
| 1 | 1 | 1 | Z | Z |

Fig. 7b

| A | B | C | D | OUT (P1=0) | OUT (P1=1) |
|---|---|---|---|---|---|
| 0 | 0 | 0 | 0 | 1 | Z |
| 0 | 0 | 0 | 1 | 1 | Z |
| 0 | 0 | 1 | 0 | 1 | Z |
| 0 | 0 | 1 | 1 | Z | Z |
| 0 | 1 | 0 | 0 | 1 | Z |
| 0 | 1 | 0 | 1 | 1 | Z |
| 0 | 1 | 1 | 0 | Z | Z |
| 0 | 1 | 1 | 1 | 1 | Z |
| 1 | 0 | 0 | 0 | Z | Z |
| 1 | 0 | 0 | 1 | 1 | Z |
| 1 | 0 | 1 | 0 | Z | Z |
| 1 | 0 | 1 | 1 | 1 | Z |
| 1 | 1 | 0 | 0 | Z | Z |
| 1 | 1 | 0 | 1 | Z | Z |
| 1 | 1 | 1 | 0 | Z | Z |
| 1 | 1 | 1 | 1 | Z | Z |

Fig. 8b

| A | B | C | D | OUT (P1=0) | OUT (P1=1) |
|---|---|---|---|---|---|
| 0 | 0 | 0 | 0 | 1 | N |
| 0 | 0 | 0 | 1 | 1 | N |
| 0 | 0 | 1 | 0 | 1 | N |
| 0 | 0 | 1 | 1 | N | N |
| 0 | 1 | 0 | 0 | N | N |
| 0 | 1 | 0 | 1 | N | N |
| 0 | 1 | 1 | 0 | N | N |
| 1 | 0 | 0 | 1 | N | N |
| 1 | 0 | 0 | 0 | N | N |
| 1 | 0 | 1 | 1 | N | N |
| 1 | 1 | 0 | 0 | N | N |
| 1 | 1 | 1 | 1 | N | N |
| 1 | 1 | 0 | 1 | N | N |
| 1 | 1 | 1 | 0 | N | N |
| 1 | 1 | 1 | 1 | N | N |

Fig. 9b

| A | B | C | OUT (P1=0) | OUT (P1=1) |
|---|---|---|---|---|
| 0 | 0 | 0 | 1 | N |
| 0 | 0 | 1 | 1 | N |
| 0 | 1 | 0 | 1 | N |
| 0 | 1 | 1 | 1 | N |
| 1 | 0 | 0 | 1 | N |
| 1 | 0 | 1 | N | N |
| 1 | 1 | 0 | N | N |
| 1 | 1 | 1 | N | N |

Fig. 10b

| A | B | C | D | OUT |
|---|---|---|---|-----|
| 0 | 0 | 0 | 0 | 1 |
| 0 | 0 | 0 | 1 | 1 |
| 0 | 0 | 1 | 0 | 1 |
| 0 | 0 | 1 | 1 | 0 |
| 0 | 1 | 0 | 0 | 1 |
| 0 | 1 | 0 | 1 | 1 |
| 0 | 1 | 1 | 0 | 1 |
| 0 | 1 | 1 | 1 | 0 |
| 1 | 0 | 0 | 0 | 1 |
| 1 | 0 | 0 | 1 | 1 |
| 1 | 0 | 1 | 0 | 1 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 0 |

Fig. 12b

| A | B | C | OUT (P=0) | OUT (P=1) |
|---|---|---|---|---|
| 0 | 0 | 0 | 1 | 1 |
| 0 | 0 | 1 | 1 | 0 |
| 0 | 1 | 0 | 1 | 0 |
| 0 | 1 | 1 | 1 | 0 |
| 1 | 0 | 0 | 1 | 0 |
| 1 | 0 | 1 | 1 | 0 |
| 1 | 1 | 0 | 1 | 0 |
| 1 | 1 | 1 | 0 | 0 |

Fig. 14c

SEMICONDUCTOR DEVICE STRUCTURE HAVING MULTIPLE GATE TERMINALS

CROSS-REFERENCE TO RELATED APPLICATIONS

This Utility Patent Application claims priority to German Patent Application No. DE 10 2019 009 096.9, filed Dec. 30, 2019, which is incorporated herein by reference.

BACKGROUND

The present disclosure relates to field effect transistors.

Traditional microelectronics is dominated by metal oxide field effect transistors (MOSFETs). A MOSFET is a three-terminal switching device that includes a source terminal, a drain terminal and a gate terminal, that is isolated from the other terminals via a dielectric isolator. The electrical conduction in the channel of a MOSFET is fixed by doping providing electron (n-type) or hole (p-type) conduction. Various types of MOSFETs have been developed, which differ regarding their conduction mechanism, as well as their structural configuration. The channel conductivity of the MOSFET is adjusted by the voltage applied to the gate terminal which does not change the conduction mechanism. Normally-off MOSFET transistors ether with n-type or p-type conduction are fabricated such that the channel has no conductivity if 0 V are applied to the gate terminal.

A second class of field effect transistors are reconfigurable field effect transistors using multiple gate terminals often by a single channel region where the conduction mechanism can be altered by a change of the external voltage applied to the gate terminals. A typical example is a transistor, which can be configured either to electron or hole conduction. Another example is the reconfiguration of the conduction mechanism itself, for example from inversion mode conduction to band-to-band tunneling conduction. In order to facilitate this functionality, reconfigurable transistors need at least two gate terminals. Devices with three or even more gate terminals in series have also been described.

A typical reconfigurable transistor exhibits metal to semiconductor contacts at the source and drain terminals. These contacts can be either Ohmic, e.g. in the case of a band-to-band tunneling field effect transistors, or characterized by a Schottky barrier. In a typical silicon based reconfigurable transistor, both contacts employ nickel silicide with a near midgap Schottky junction as contact material, to enable a reconfiguration between electron and hole conduction. In such reconfigurable transistors, direct control of the junction by two gates aligned atop the metal to semiconductor contact is used to ensure the carrier flow. However, other material combinations with different Schottky barrier heights are feasible as well, for example germanium and germanium manganite.

A third class of field effect transistors, are normally-ON transistors. Among those, the most famous is called a junctionless field effect transistor. This transistor type features a narrow, but highly conductive channel, which can be electrostatically depleted in order to turn the transistor off. If no external signal is applied such that the voltage applied to the gate terminal is 0 V, the device is always conducing. Although called "junctionless", these are typically built with Ohmic metal to semiconductor contacts in order to facilitate a connection to the surrounding circuit. Similar to MOSFETs, junctionless transistors only have a single gate terminal.

Field effect transistors are the basic building blocks for integrated electronic circuits, such as microprocessors. A single integrated circuit includes thousands of individual devices connected to yield a desired electrical function. To increase the number of transistors per unit area, the area needed for individual transistors is reduced, typically by shrinking the device size. This process is known as scaling. Transistors with multiple gate terminals open up new ways of scaling integrated circuits, as they combine multiple functions in a single element. As a result, the overall number of functions on a chip can be increased, even when the number of devices is kept constant.

To form an integrated circuit, several transistors have to be connected to one another. The two base variants are series connection, i.e. two transistors in a row, and parallel connection, i.e. two transistors next to each other. A number of parallel and serial paths forming a connection from a supply line to an output is called network. Several networks are combined to form a specific circuit. This is realized via subsequent metal layers, which are stacked atop of the transistors themselves. The connection between these metal layers and the transistors is typically embodied by doped raised source or drain epitaxial areas in close vicinity to both edges of the gate terminal of a MOSFET. Atop of these raised source drain areas, a self-aligned silicide is formed via a thermally activated diffusion process, which is then contacted by a metal plug. With further miniaturization of the transistors, the electrical resistance of this contact becomes a major contribution to the overall resistance of the transistors. This effect is even stronger in Schottky barrier based devices.

The precise, uniform and reliable fabrication of such metal contacts is one of the biggest challenges for fabrication of highly scaled electronic devices. If single transistors with metal-to-semiconductor contacts with large lateral dimensions are fabricated, i.e. gate lengths of 100 nm or more, a metallic reservoir in a far lateral distance if often used to provide the metal to semiconductor contacts at source and drain. However, the large distance to the metallic reservoir obstructs a fabrication on small scales and can be accompanied by a variability of the position of the contact to the channel. In the case of reconfigurable transistors, which employ a metal semiconductor alloy to semiconductor contacts below the gate terminals, an alloy contact formation through the entire raised source drain area would inflict a high amount of stress, and thus introduce potential failures into the structure. In addition, the diffusion process is prone to a high variability. Therefore, a precise alignment of the contact under or near the gate terminals cannot be ensured for a high number of transistors. While normally on-transistors, such as junctionless transistors, don't require the same amount of precision in terms of the electrical contact formation, a metal to semiconductor contacts close the gate area is beneficial, as such a structure would decrease the overall resistance and minimize parasitic capacitances.

In view of the above, a solution for forming precise metal contacts under the outer gate terminals of a transistor with multiple gate terminals, which is also compatible with a dense integration of many devices connected to each other, is needed. In addition, an overall amount of contact resistance and parasitic capacitances per network should be minimized. With this in mind, examples of the present disclosure provide devices that address such issues and methods for the formation of such devices.

SUMMARY

The present disclosure provides integrated circuits comprising field effect transistors having metal to semiconductor contacts as well as more than one gate terminal. In this disclosure integrated circuits of field effect transistors with multiple gate contacts (105) are disclosed where, in some examples, such gate contacts are independent (FIG. 1, cross section). The gate contacts (105) are adjacent to each other using a same (or one) channel (101) and common source and drain contacts (124) formed by metal to semiconductor contacts at the channel ends. In examples, a gate terminal comprises a metal or semiconductor contact (105) with two adjacent dielectric spacers (106), which are isolated from the channel region by at least one dielectric layer, such as a high-k dielectric (104) and have an electrical connection to another network or circuit (110).

In accordance with examples of present disclosure, the gate terminals are separated into two groups (FIG. 2, top view): First, the most outer gate terminals (221), which are located near the channel ends, and second gate terminals which are located between two or more other gate terminals (220). Further in accordance with examples of this disclosure, the channel is of two or more parts (referred to as sub-channels or channel parts), where such sub-channels may have no gate contact, or one or more gate contacts. It is noted that the terms "sub-channel" and "channel part" may be used interchangeably herein.

In accordance with examples of the present disclosure, the channel comprises of a number of channel parts. Further in accordance with examples of the present disclosure, the channel comprises a node formed by a junction of three or more channel parts electrically. Another example of a field effect transistor, in accordance with the present disclosure, comprises two or more nodes connecting four or more channel parts electrically. In some examples of the present disclosure, a node splits the channel into different parts or unifies the channels parts to one channel and, in some embodiments, one or more gate terminals (220) are used to control the conductivity of the channel parts.

In examples, the channel parts are electrically independent or autonomously controlled by their gate contacts. Other than the nodes formed by the junction of three or more channel parts, each channel part is electrically isolated from other channel parts of the transistor by dielectric materials. Consequently the channels of different transistors are also separated by dielectric materials in accordance with this disclosure.

Additionally, in some examples, it may be of advantage to extend the channel or sub-channels into a third dimension, a direction which is perpendicular to a substrate surface. Consequently, in some examples, common source drain contacts formed by metal to semiconductor contacts at the channel ends can be extended or are positioned in the third dimension perpendicular to the two dimensions described by the channel parts or the surface of a substrate.

All sub-channels can be oriented horizontally or vertically as compared to the substrate surface. A single channel can comprise a mixture of horizontal and vertical sub-channels. In some examples, multiple sub-channels can be used in parallel. In some examples, this can also be realized in stacked form, where individual gates can be shared between horizontal and vertical sub-channels of either the same or different devices.

In accordance with the present disclosure, the one or more gate contacts may be positioned to control the channel or sub-channel conduction. Further in accordance with examples of the present disclosure, the sub-channel ends (FIG. 2) are carried out as raised source or drain terminals (222) connected by a metal-alloy line or track (223) to form metal alloy to semiconductor contacts at the channel (201) ends, located below or near the most outer gate terminals (221).

In one example, the metal to semiconductor contacts are Schottky contacts forming Schottky barriers where, in some cases, the channel is of low conductivity and has a low amount of free charge carries when no external fields are applied. In another example, the metal to semiconductor contacts are of Ohmic behaviour where, in some cases, the channel is of high conductivity and has a high amount of free charge carries when no external fields are applied.

Further in accordance with examples of the present disclosure, the metal to semiconductor contacts for reconfigurable field effect transistors are carried out at the channel ends as source or drain contacts (124) of Schottky barrier type positioned under or at the appropriate gates (105) (FIG. 1). In another example, the metal to semiconductor contacts for junctionless field effect transistors are carried out at the channel ends as source or drain contacts not positioned under or at the appropriate gates.

In accordance with examples of the present disclosure, the metal to semiconductor contacts (124) are connected by metal-alloy conductor lines or tracks (123). In one example of the present disclosure, the metal-alloy conductor (108) reaches to the top part of raised source and drain areas (107) next to the channel (FIG. 1). Further in accordance with examples of the present disclosure, a spacing is realised between the raised source drain contact areas and the gate contacts which are above the metal to semiconductor contacts at the channel ends.

According to examples, the present disclosure provides a structure which is able to reduce the amount of contact resistance and parasitic capacitances per network. As a consequence of its scalability, the disclosed concept reduces variability and provides higher reliability and performance. As a result, the functionality of an arbitrary logic network can be realized within a single transistor as described by the present disclosure. In doing so, the overall amount of contact resistance and parasitic capacitances is reduced as both are only needed once per network instead of once per device. However, it is still possible to build a network of more than one device or use a single device as several sub-networks.

According to examples, the present disclosure enables a scaling of reconfigurable field effect transistor concepts or normally on-transistor concepts as well as a co-integration in a CMOS platform. The present disclosure includes a process for forming a precise metal-to-semiconductor contact (124) at the channel ends under or near the appropriate gates (105) of a transistor with multiple gate terminals, which is compatible with dense integration of many gate contacts adjacent to each other using the same channel (101) (FIG. 1). The present disclosure includes an arbitrarily shaped semiconductor channel region (101) as part of a semiconductor material, on top a dielectric region (102) on top a semiconductor substrate (103) (FIG. 1). In another example of present disclosure, the arbitrarily shaped semiconductor channel region is part of a semiconductor substrate.

In one example, on top of the arbitrary shaped semiconductor channel region (101), a gate dielectric (104) is formed and, subsequently, two or more gate terminals are placed on top of the gate dielectric (105). Each sub-channel can be gated by one or more individual gate terminals. According to such example, the overall number of gate terminals thereby is at least two. In one example, an area between the gate terminals is isolated by a dielectric (109) and no electric contact to the channel is formed, while at the outer edges of the outer gate structures raised source and drain regions (107) are formed in a way of having a substantial lateral distance from the adjacent gate structure.

In one example, a metal semiconductor alloy (123) is formed in the channel portion near the outer gate structures such, that a metal semiconductor alloy to semiconductor junction (124) is formed in the vicinity of the outer gate structures, but not between two adjacent individual gate structures. Accordingly, metal semiconductor alloy contacts can be formed and very fine tuned in close proximity to the channel and without a high variability. In addition, an electrical contact to the top of the raised source drain structures can be formed in order to assure the possibility of contacting the transistor to the metal layers above, forming the circuit. In general, at least two metal to semiconductor junctions are formed in a device, but devices with more than two metal to semiconductor junctions are possible, depending on the number of sub-channels and nodes.

The teachings of the present disclosure are fully compatible with a standard-CMOS process. A co-integration with classical CMOS devices is possible.

BRIEF DESCRIPTION OF THE DRAWINGS

FIG. 4b: A Logic table of the device in FIG. 4a.

FIG. 5b: Logic table of the device in FIG. 5a for OUT1 depending on gate terminal A, and OUT2 depending of gate terminal B, both OUT1 and OUT2 depending on the same terminal IN.

FIG. 6b: Logic table of the device in FIG. 6a.

FIG. 7b: Logic table of the device in FIG. 7a.

FIG. 8b: Logic table of the device in FIG. 8a.

FIG. 9b: Logic table of the device in FIG. 9a.

FIG. 10b: Logic table of the device in FIG. 10a.

FIG. 12b: Logic table of the device in FIG. 12a.

FIG. 14c: Logic table of the device in FIG. 14a.

DETAILED DESCRIPTION

Figure 1:
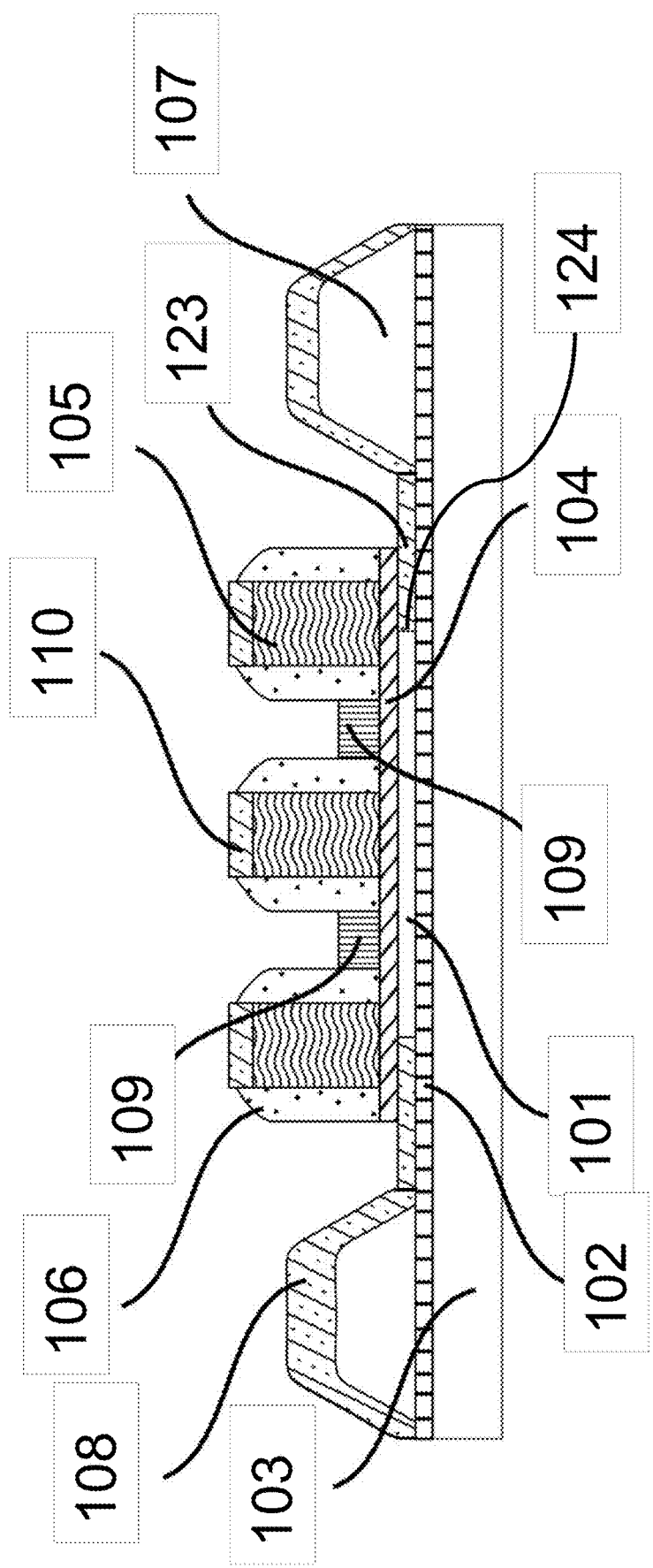
FIG. 1: Cross-section depicting a device structure of a reconfigurable transistor with three gate contacts (105) formed on a substrate (103) comprising at least a first semiconductor channel region (101) according to one example of the present disclosure

In order to reduce power consumption and information transmission time, there is a need for innovative approaches to devices and architectures which are able to extend current technology and potentially provide new information processing platforms. The present disclosure achieves this by providing integrated circuits including field effect transistors having metal to semiconductor contacts as well as more than one gate terminal. According to the present disclosure integrated circuits of field effect transistors with independent multiple gate contacts (105) are described (FIG. 1). The gate contacts (105) are patterned next to each other using the same channel (101), and common source drain contacts are formed by metal to semiconductor contacts at the channel ends.

In accordance with the present disclosure, the channel (201) (FIG. 2) is of two or more sub-channels or channel parts having no gate contacts or one or more gate contacts (220 and 221). The sub-channels or channel parts are connected at nodes or junctions. Additionally, in accordance with this disclosure it is of advantage extending the channel parts or sub-channels into the third dimension which is the direction perpendicular to the area spanned off by two sub-channels which in most cases is the plan area of a substrate. Consequently common source drain contacts formed by metal to semiconductor contacts at the channel ends can be extended or are positioned in the third dimension which is the direction perpendicular to the area spanned off by two sub-channels or a substrate.

In accordance with the present disclosure, an integrated circuit comprises a transistor comprising a semiconductor channel and the channel comprises three channel parts or sub-channels. Further in accordance with this disclosure an integrated circuit comprises a transistor comprising a semiconductor channel comprising a node connecting three channel parts electrically. Additionally, in accordance with this disclosure the semiconductor channel comprises more than one node connecting three or more channel parts electrically.

In one example, Schottky contacts are formed at each end of the channel. A gate contact is positioned to control the Schottky barrier type of each Schottky contact of the channel. In accordance with this disclosure the Schottky contacts are electrically independent and are electrically independent addressable. In specific embodiments two or more Schottky contacts are connected electrically to apply the same potential to the Schottky contacts connected electrically.

A gate contact is positioned to control the conductivity of one channel part. In another embodiment the semiconductor channel comprises more than one gate contact positioned to control the conductivity of one channel part. Further in one embodiment of the disclosure the channel comprises more than one gate contact to control the conductivity of a channel part. In accordance with this disclosure the gate contacts are electrically independent and are electrically independent addressable. In specific embodiments two or more gate contacts are connected electrically to apply the same potential to the gate contacts connected electrically.

In other examples of the transistor channel comprising one or more nodes connecting three or more channel parts electrically Ohmic contacts are formed at each end of the channel. One or more gate contacts are positioned to control the conductivity of one channel part or are positioned to control the conductivity of a channel part. Each sub-channel or channel part is controlled by a separate gate contact.

One example of this disclosure is an integrated circuit comprising a planar or vertical semiconductor channel with two ends. The channel is split into multiple or comprises multiple sub-channels or channel parts in between the two ends of the semiconductor channel.

In one example of the present disclosure the transistor of an integrated circuit element is designed such that the semiconductor channel has multiple source or drain Schottky contacts which, in some examples, are in parallel to each other. The polarity of each of the Schottky contact is controlled by a gate contact. Within specific embodiments the conductivity of one or more sub-channels are controlled by one or a more number of gate contacts in series controlling different segments along the sub-channels.

In one example, multiple parallel planar sub-channels or channel parts are connected together to a joint source or drain Schottky contact. Additionally the Schottky contacts are connected to one or more planar sub-channels. In another embodiment the multiple parallel planar sub-channels are connected together to a joint source or drain Schottky contact which is perpendicularly orientated to the planar sub-channels of channel parts. In another embodiment the Schottky contacts are orientated vertically to a substrate and are connected by one or more sub-channels being parallel orientated to a substrate.

In another example of the present disclosure the transistor of an integrated circuit element is designed such that the semiconductor channel has more than one Ohmic contact which, in some examples, are in parallel to each other. For each sub-channel the conductivity is controlled by a separate gate contact. Within specific embodiments the conductivity of one or many sub-channels are controlled by one or a multiple number of gates in series controlling different segments along the sub-channels.

Further in accordance with the present disclosure, in integrated circuits comprising more than one transistor described herein, the transistors are separated by isolating material mainly. Channel parts of two or more transistors connected by nodes (sometimes called point contacts or node contacts) are electrically separated by gate contacts electrically applying the respective potentials needed to achieve the electrically separation of the two or more transistors.

Figure 2:
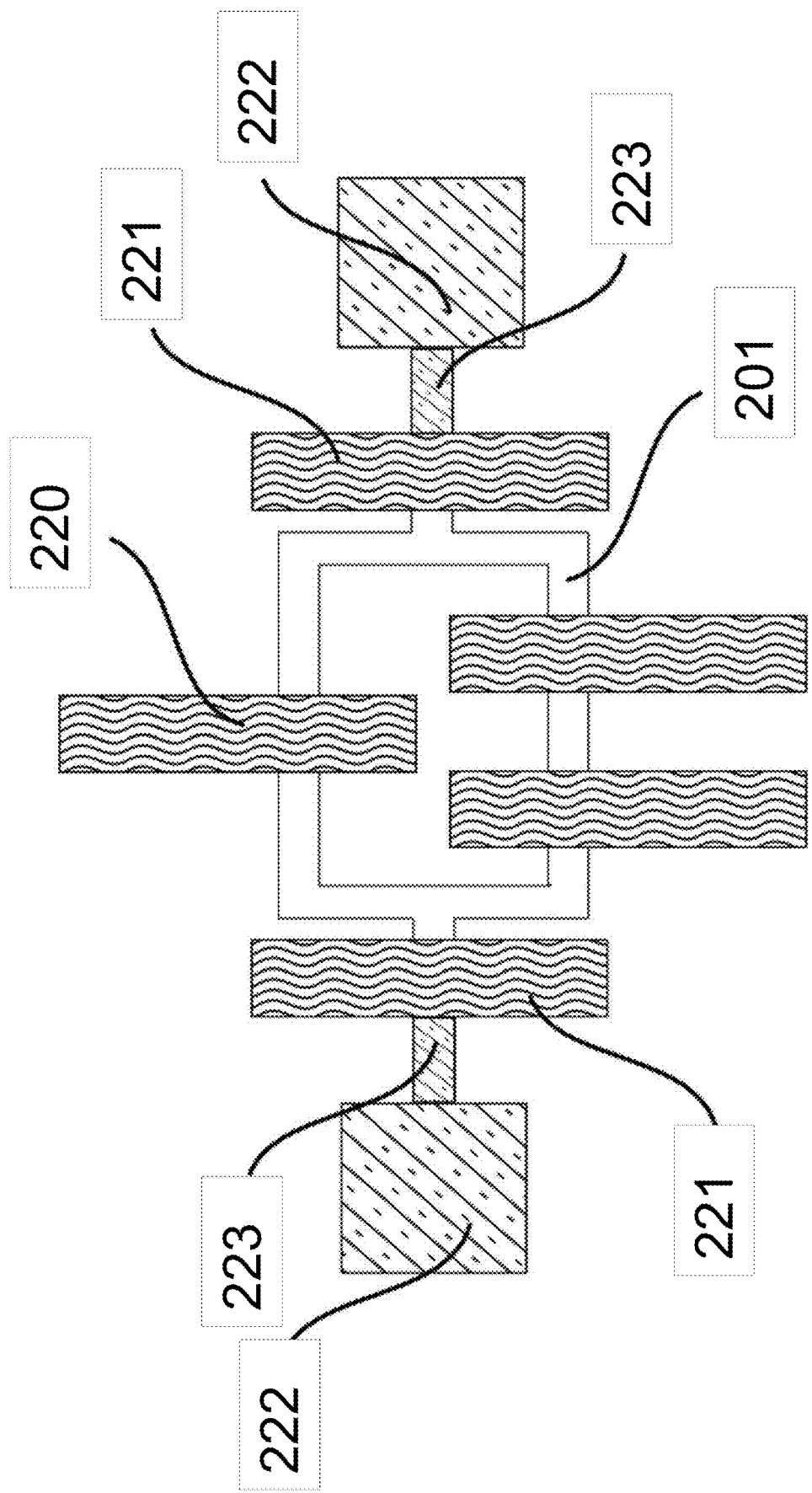
FIG. 2: Top-view of an example of a transistor according to the present disclosure comprising a single channel (201) and multiple independent gate terminals (220), where one part of the channel is of two sub-channels and the two channels are forming a parallel network.

FIG. 2 describes a top-view of an example of a reconfigurable or junctionless transistor, in accordance with the present disclosure, including a channel (201) where one part of the channels is split into or is of two sub-channels at a node. The two sub-channels form a parallel network, which is a serial network with the other parts of the channel. Multiple independent gate structures (220) are shown adjacent to the sub-channels. In this embodiment two of them can be distinguished as the most outer gate structures (221). A metal semiconductor alloy (223) is formed in the vicinity of the two outer gate terminals (221) directly on the semiconductor channel. A contact formation between two individual gates is prevented. Raised source and drain terminals with a metal semiconductor alloy on top (222) are connected electrically to the channel (201) by an alloy, which forms electrical contacts directly at the channel (201) ends.

In accordance with this disclosure, a cross-sectional view depicting the device structure of a reconfigurable transistor with three gate terminals is shown in FIG. 1. A multitude of gate terminals, in FIG. 1 three gate terminals, is formed on a substrate comprising at least a first semiconductor channel region (101) atop a dielectric layer (102) atop a semiconductor body (103). A gate terminal thereby comprises of a metal or semiconductor contact (105) with two dielectric spacers (106) adjacent, which are isolated by the channel region by at least one dielectric layer, typically a high-k dielectric (104).

In the depicted example, a metal semiconductor alloy (110) is formed on-top of the gate metal stack or poly silicon (105) in addition. The channel portion between two gate terminals is passivated by the same dielectric layer. The individual gate contacts are isolated to each other. Raised source and drain areas (107) are formed to ensure a connection of the device to subsequent metal layers. A metal semiconductor alloy is formed in the vicinity of the two outer gate terminals directly at the end of the semiconductor channel (101), as well as on the raised source and drain areas (108) adjacent. The area between the gate terminals is isolated by a dielectric (109). No electric contact to the channel is formed between two gate terminals. Utilizing this structure, the position of the metal semiconductor alloy to semiconductor junction (124) between the semiconductor channel (101) and the metal alloy (108 and 123), which preferably is also connected to the raised source drain areas (107), is adjusted with a reduced variability.

In one example of a planar implementation of the transistor described by FIG. 1 or 2, the channel is made of monocrystalline silicon. The channel dimensions are 5 nm high, 20 nm wide and 600 nm long. The silicon layer is on top of a $SiO_2$ layer (102) on top of a silicon substrate (103). The silicon of the channel is intrinsic or lowly p-doped below 10E16 dopants per $cm^3$. The crystal orientation of the silicon sub-channels are [110] described by the Miller indices. The channel has a thermally grown $SiO_2$ dielectric shell (104) of 5 nm thickness. The gates (105) are made of 10 nm thick ALD-deposited TiN with a work function of 4.8 eV and 30 nm Pt covering the TiN. The gates (105) are 300 nm wide. Adjacent gates are placed in 150 nm distance to each other. The spacers (106) are made of SiN. The raised source and drain regions (107) are made from epitaxial grown silicon, and 40 nm long, 40 nm wide and 40 nm high at the point of its largest extension. The remaining dielectric masking material between the gates (109) consists of sputtered $SiO_2$. The metal alloy (123) at the contact (124) is made from nickel-silicide with an atomically sharp interface to the silicon of the channel. Nickel silicide in this embodiment has an effective work function of 4.84 eV and form lines or tracks (108) of nickel-silicide reaching on top of the raised source and drain areas.

Figure 3:
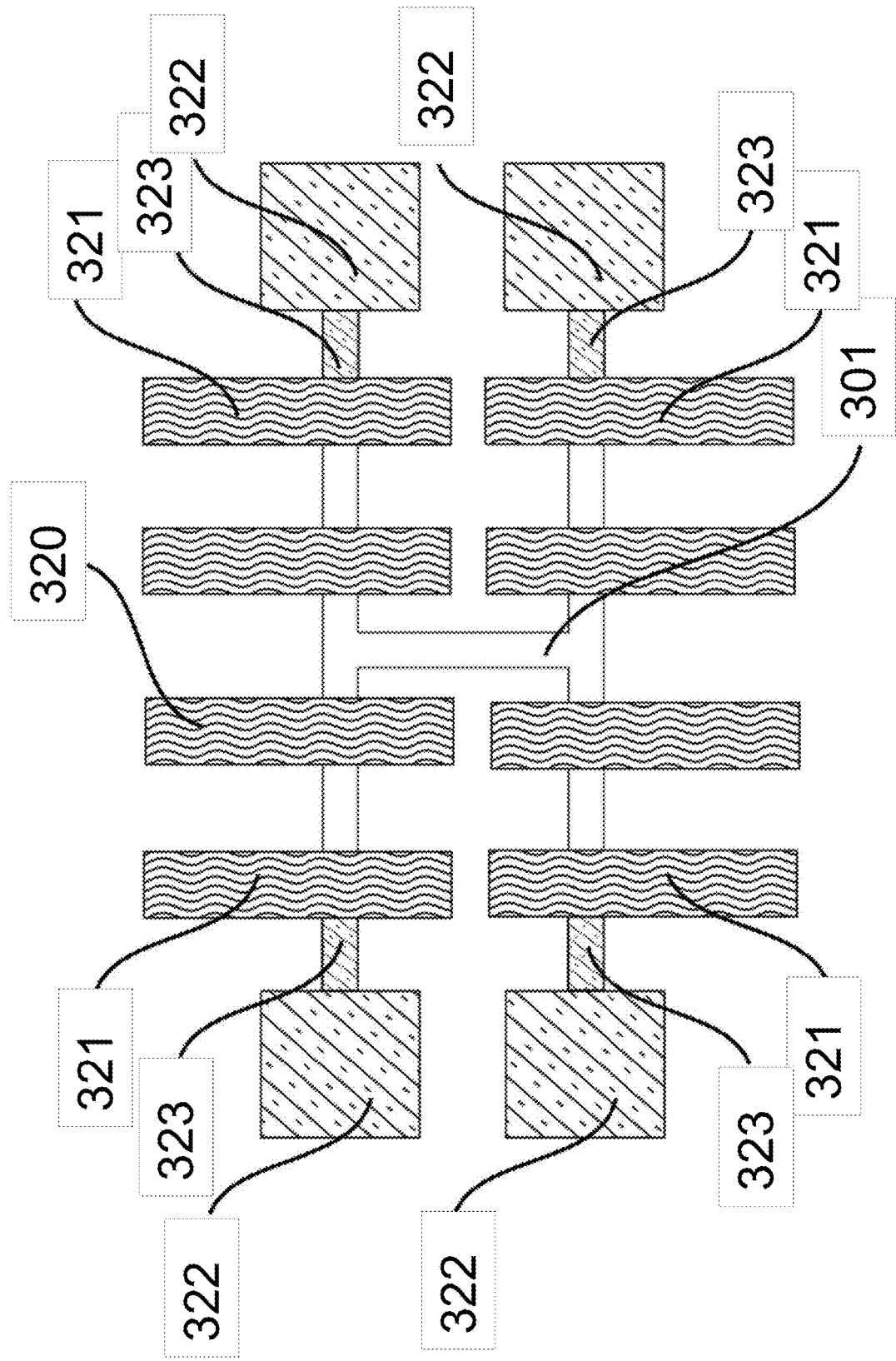
FIG. 3: Top-view depicting another example of a transistor according to the present disclosure including a channel (301) having five sub-channels with two nodes formed and eight gate terminals (320), whereas four gates are referred as the most outer gates (321).

FIG. 3 shows a top-view depicting another embodiment of a reconfigurable or junctionless transistor in accordance with the present disclosure including a channel (301) having five sub-channels connected by two nodes. Multiple gate structures (320) are patterned above the channel. In this embodiment, the channel is formed in a way, that four gate contacts are the most-outer gate contacts positioned such that metal to semiconductor contacts are positioned at the end of the respective sub-channels under the appropriate gate contacts (321). Raised source and drain terminals with a metal semiconductor alloy on top (322) are formed with a substantial distance to all four of this most outer gate contacts. A metal semiconductor alloy (323) is formed in the vicinity of the two outer gate terminals directly on the semiconductor channel (301). A contact formation between two individual gates is prevented.

The Figures from FIG. 4 to FIG. 14 describe specific circuit elements to solve circuit task for different electronic applications which using the semiconductor transistor structures in accordance with this disclosure. The following detailed description is given by way of example of specific circuit elements and not intended to limit the disclosure solely thereto. Corresponding logic tables assumes the application of binary 1 at the inputs (IN), binary 0 at the gate covering the contact to the output (P2) and the use of reconfigurable field effect transistors (RFETs). P2 is necessary to ensure that the Schottky junction adjacent to the respective gate is open for transmission of the desired carriers. For the use of normally-on transistors, the gate covering or surrounding the contact region is not required for setting the polarity. The given truth-table remains valid. The value for P is determined by the doping type instead and is fixed for each individual embodiment. The corresponding logic tables for normally-on transistors require the opposite input signal levels as for RFETs to generate the same output.

All devices with more than two gates may be also used as transfer gates if all most outer gates are steered simultaneously with equal programming.

Figure 4A:
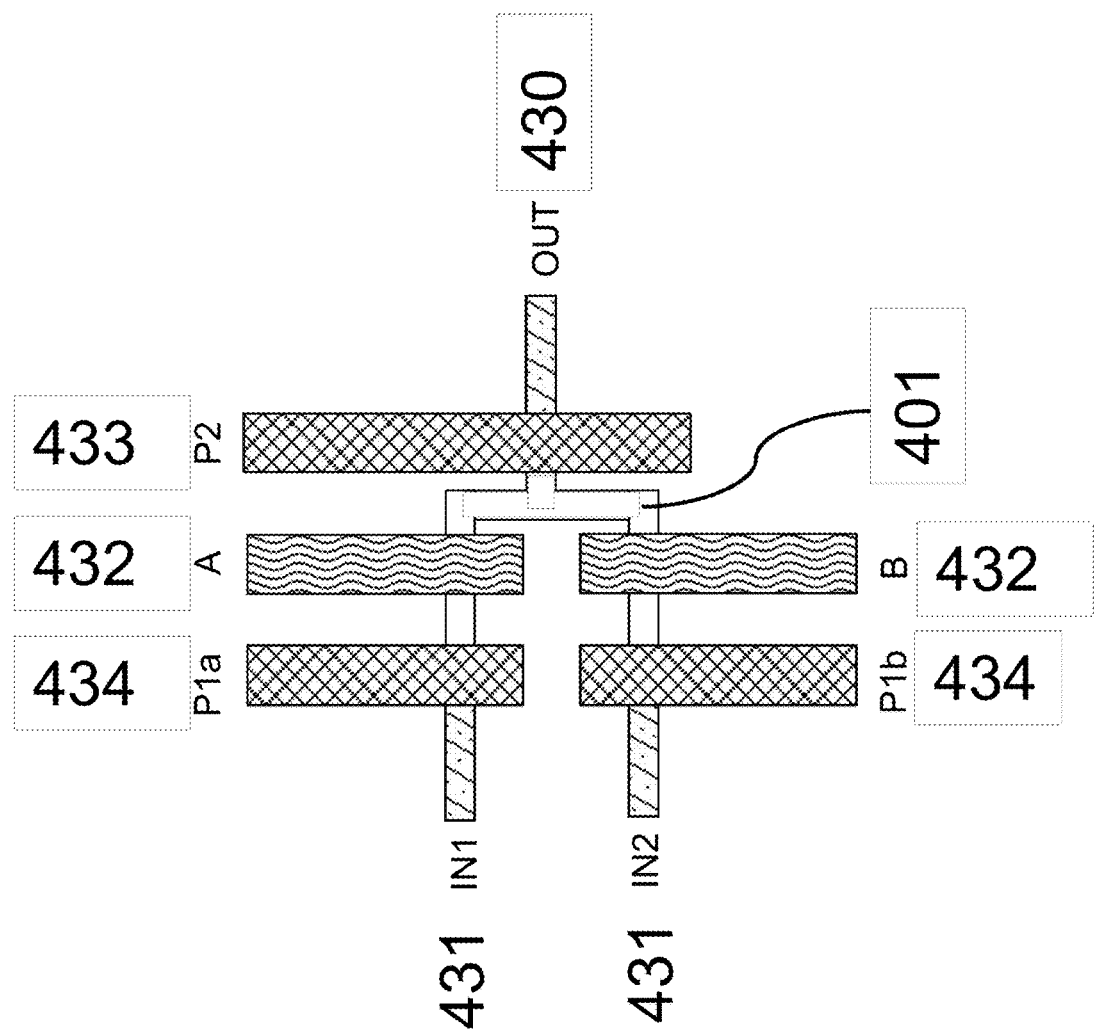
FIG. 4a: Top-view of a transistor, according to one example, having a function to route the signals at two independent input terminals (431) to one output (430) terminal.

FIG. 4a is depicting a top-view of an example metal semiconductor device structure transistor, in accordance with the present disclosure, having a function to route two independent input terminal (431) to one output terminal (430). Such implementation can be used to form a multiplexer. The transistor is made of two sub-channels, one with input terminal (431) IN1 and control gate terminal (432) A, the other one with the input terminal (431) IN2 and the control gate terminal (432) B. Both sub-channels are connected with each other and with a third sub-channel that leads to an output terminal (430) OUT. Additional gate terminals (434) such as P1a and P1b near the input terminals (431) IN1 and IN2 can be used to integrate a wired-AND functionality of P1a and A as well as P1b and B, respectively. The fourth gate terminal (433) P2 is used to set the polarity of the device.

Figure 4C:
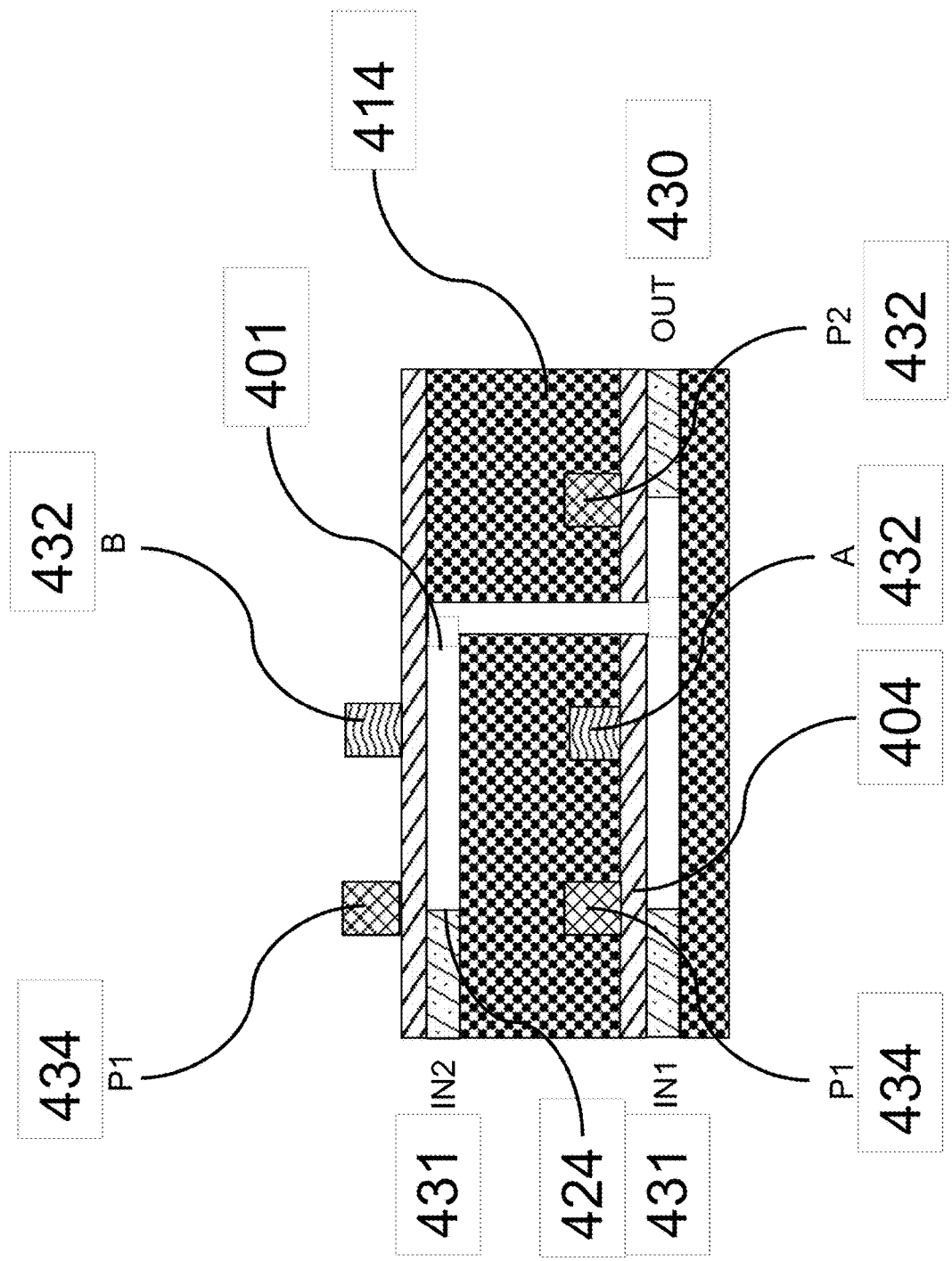
FIG. 4c: Cross section view of the metal semiconductor device of FIG. 4a as a three dimensional example of the present disclosure with two horizontal channel parts above each other and a vertical channel part connecting the two horizontal channel parts electrically.

FIG. 4b shows the logic table of the device in FIG. 4a. The output is binary 1 if at least either both, P1a and A, or P1b and B are binary 0. In other cases the output is at logic level high resistance (Z). In another embodiment of this disclosure the semiconductor device of FIG. 4a is arranged by stacking layers (FIG. 4c). A three dimensional embodiment in accordance of the disclosure by stacking layers with two horizontal channel parts above each other and a vertical channel part connecting the two horizontal channel parts electrically is shown in FIG. 4c. The channel parts are electrically isolated vertically by a dielectric layer (414), preferably a low-k dielectric. The gate terminals (432, 433, 434) for the individual signals are electrically separated by the gate dielectric layers (404) from the channel (401). Source and drain contacts are formed by metal alloy to semiconductor contacts (424) at the INPUT (431) and output (430) terminals.

In a special implementation, the transistor in FIG. 4a can be part of a network of two of such devices, which are connected at the output. If in this implementation in one device IN1 and IN2 are binary 1 and P1a, P1b and P2 are binary 0, and if these binary values are opposite in the other device, and if input A is defined as inverted signal of input B then this network can work as a multiplexer.

Figure 5A:
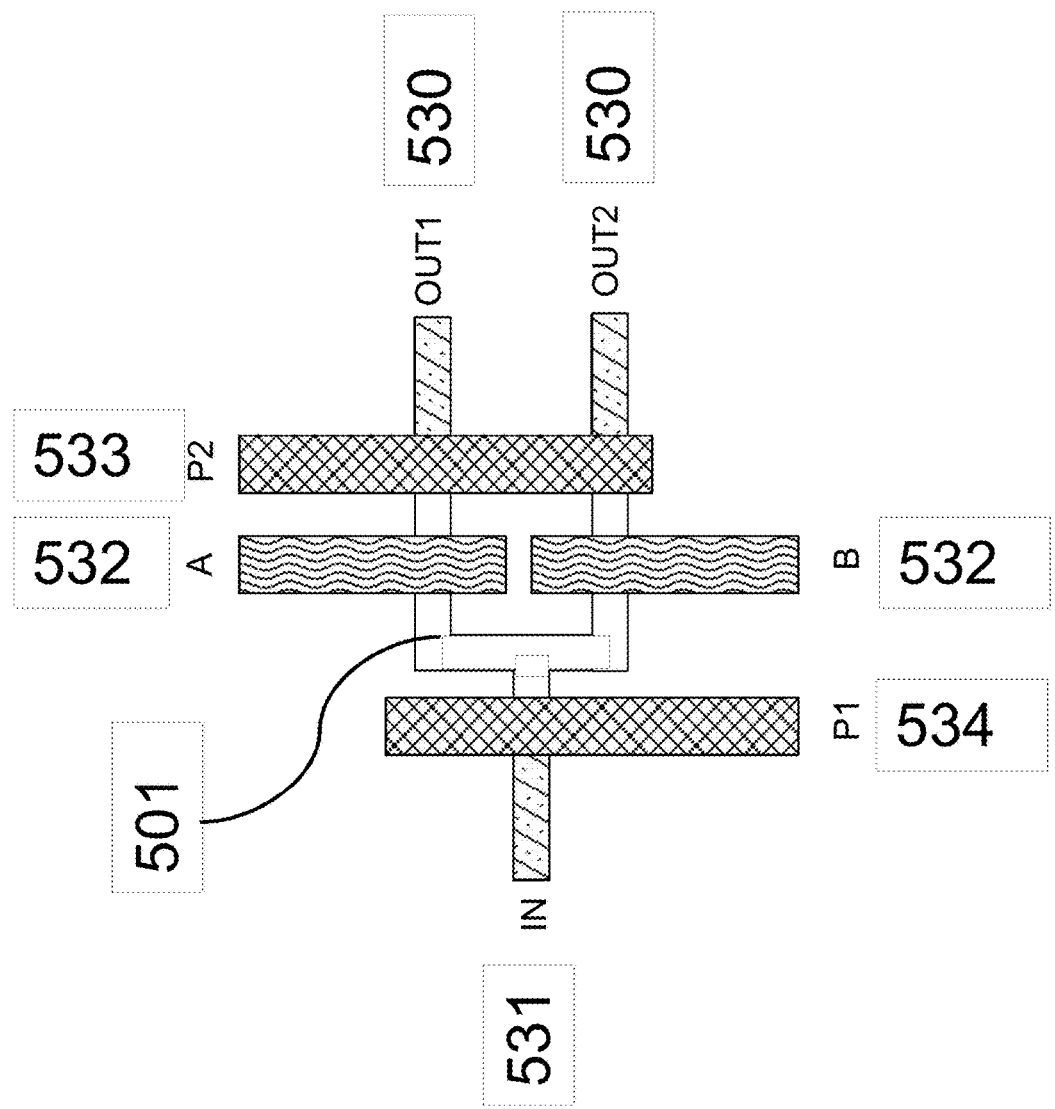
FIG. 5a: Top-view of a transistor, in accordance with examples of the present disclosure, with a function to distribute the potential at the input terminal IN (531) towards two independent output terminals OUT1 (530) and OUT2 (530).

FIG. 5a shows a top-view of another example of a transistor, in accordance with the present disclosure, with the function to distribute the potential at the input terminal (531) IN1 towards two independent output terminals (530) OUT1 and OUT2. Each of the output terminals is controlled by individual gate terminals (532), A and B. In case of an RFET the gate terminal (534) P1 is used as an additional control unit to turn the device off. The fourth gate terminal (533) P2 is used to set the polarity of the device. A higher amount of functionality can be achieved, if P1 is used as independent control signal instead.

Figure 5C:
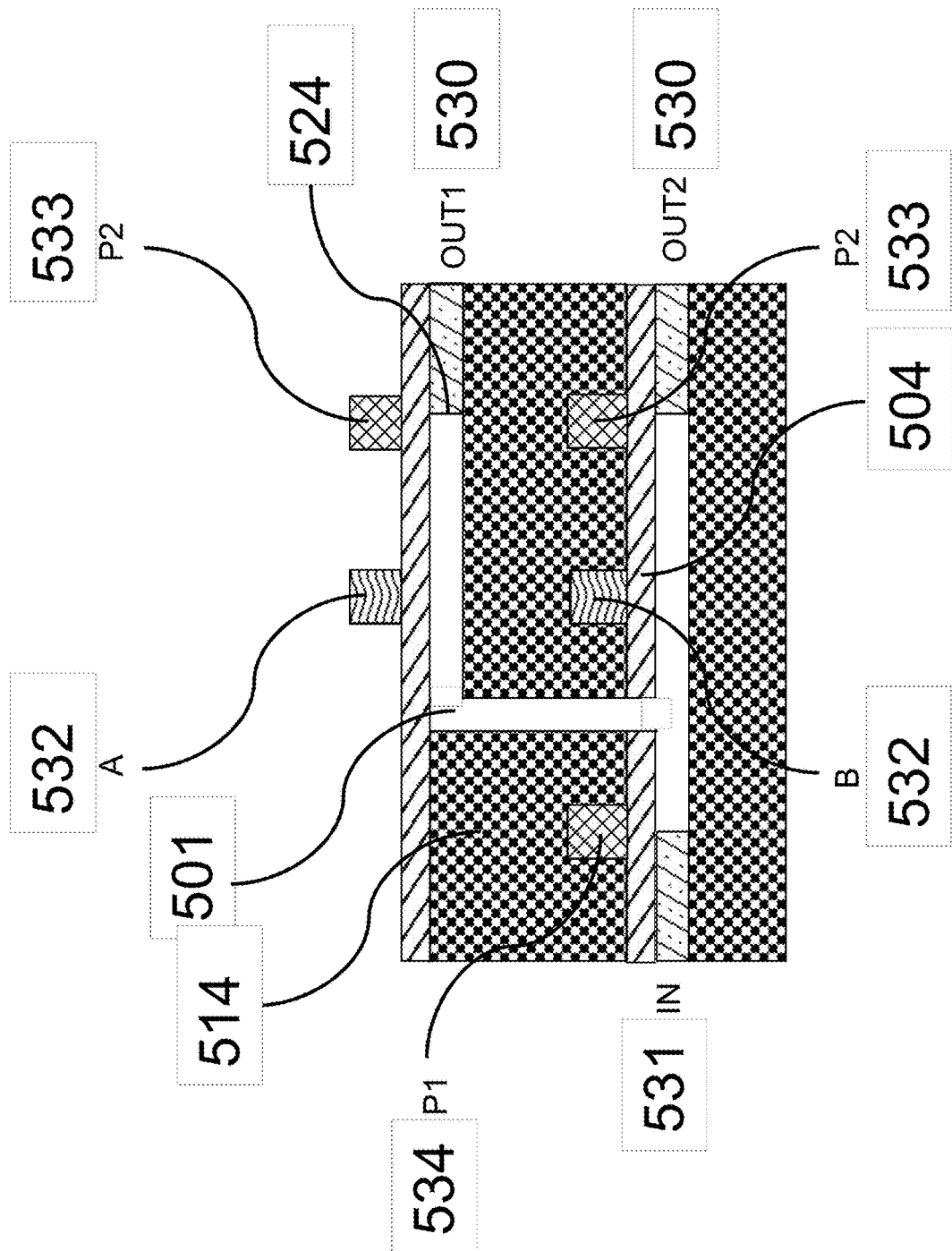
FIG. 5c: Cross section view of the metal semiconductor device of FIG. 5a as a three dimensional example of the present disclosure with two horizontal sub-channels above each other and a vertical sub-channel part connecting the two horizontal sub-channels electrically.

The binary functionality of the device in FIG. 5a is described by two tables in FIG. 5b. One table refers to the signal level at OUT1, the other one to the signal level at OUT2. In another embodiment of this disclosure the semiconductor device of FIG. 5a is arranged by stacking layers (FIG. 5c). A three dimensional embodiment in accordance of the disclosure by stacking layers with two horizontal channel parts above each other and a vertical channel part connecting the two horizontal channel parts electrically is shown in FIG. 5c. The channel parts are electrically isolated vertically by a dielectric layer (514), preferably a low-k dielectric. The gate terminals (532, 533, 534) for the individual signals are electrically separated by the gate dielectric layers (504) from the channel (501) and the source and drain terminals (530, 531), which are formed by metal alloy to semiconductor contacts (524).

Figure 6A:
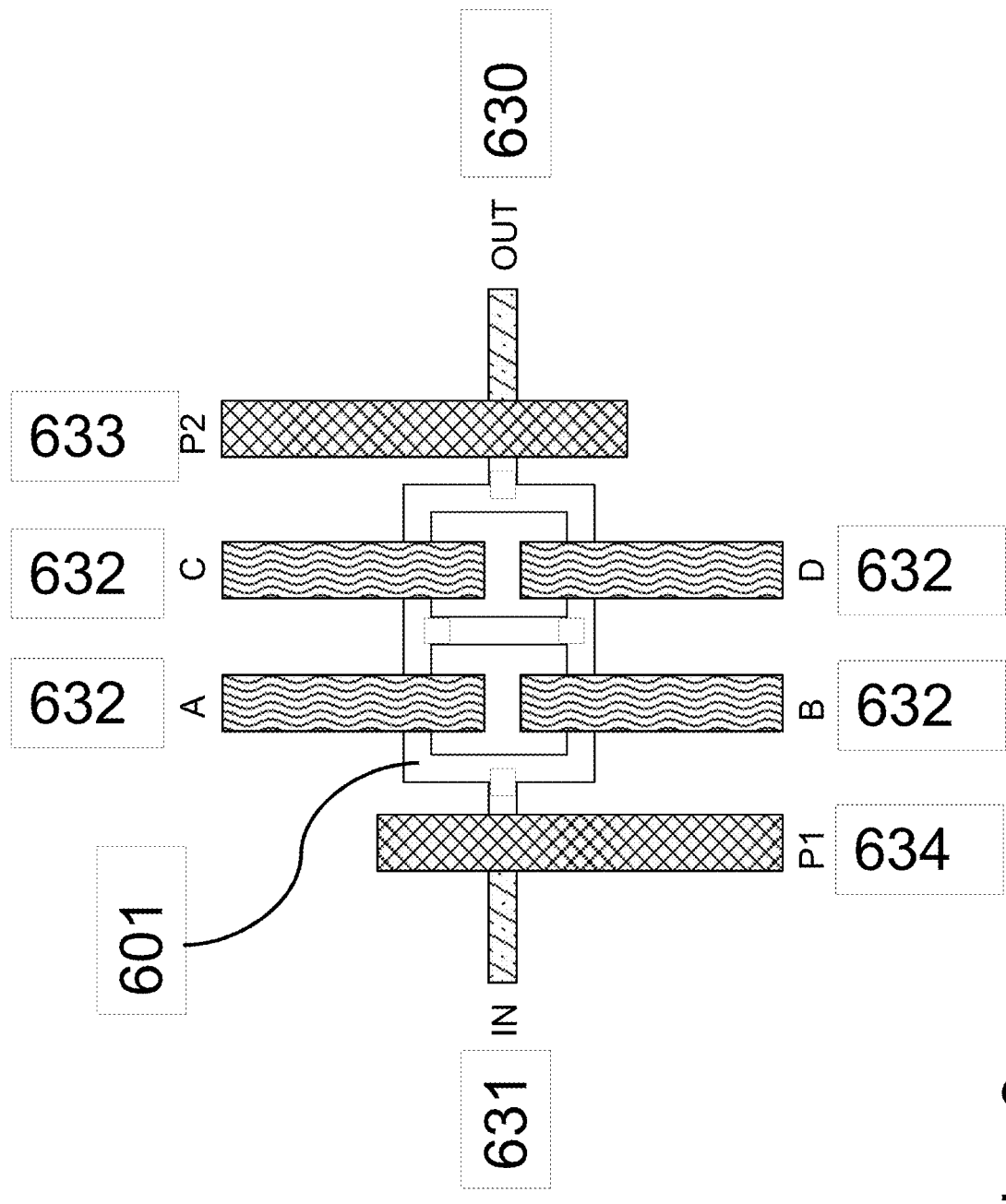
FIG. 6a: Top-view of a transistor, in accordance with examples of the present disclosure, forming a logic gate that employs an internal branching. The branching connects two parallel sub-channels that are individually gated by input signals A and B with two other parallel sub-channel that are individually gated by C and D.

FIG. 6a describes another example of the present disclosure of a logic transistor that employs an internal branching. The branching connects two parallel sub-channels that are individually gated by gate terminals (632), A and B, with two other parallel sub-channel that are individually gated by gate terminals (632), C and D. In case of RFETs the gate terminal P1 and P2 are used to set the polarity of the device. A higher amount of functionality can be achieved, if P1 is used as independent control signal instead. The binary functionality of the device in FIG. 6a is described by a table in FIG. 6b.

Figure 6C:
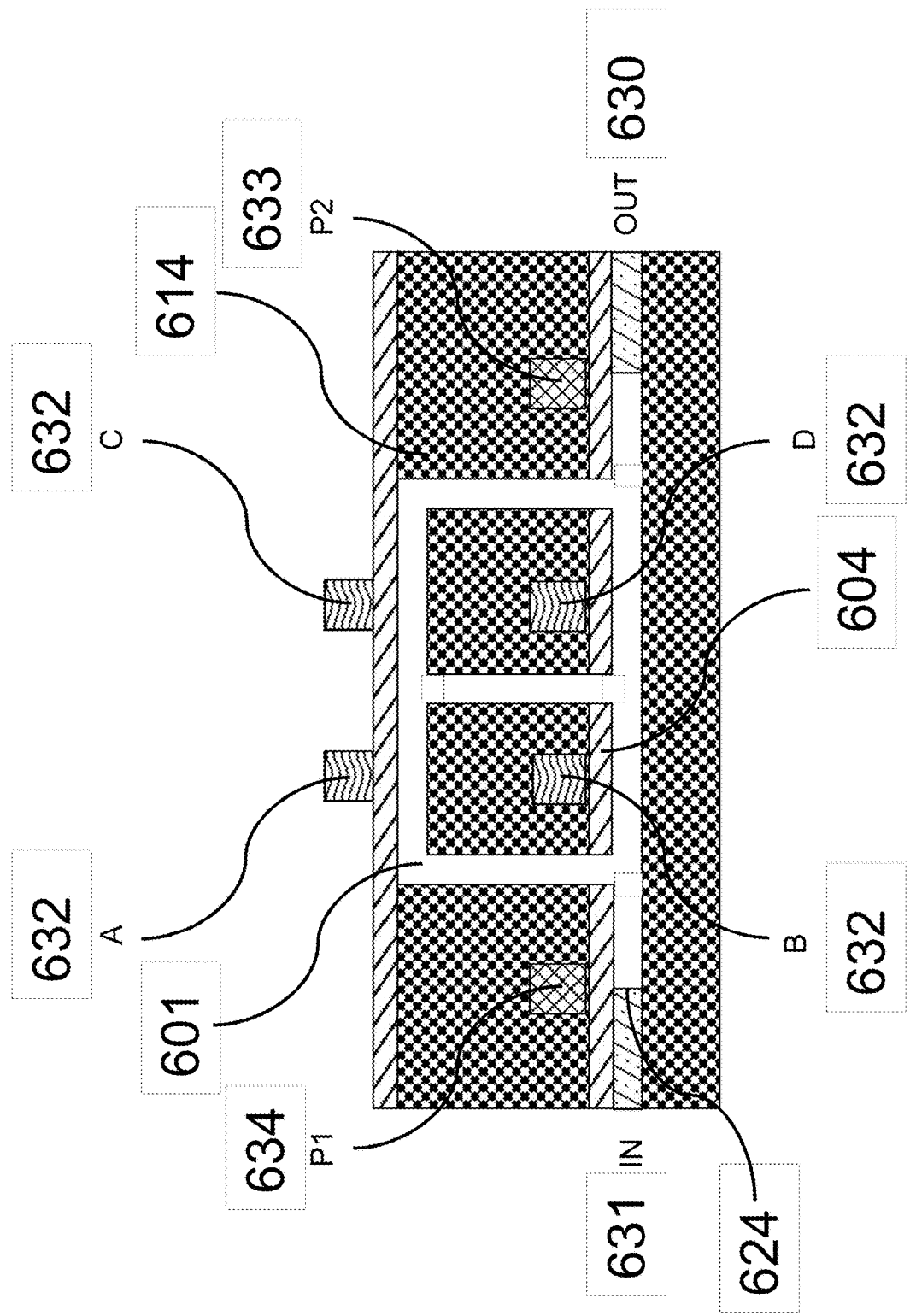
FIG. 6c: Cross section view of the metal semiconductor device of FIG. 6a as a three dimensional example of the present disclosure with two horizontal sub-channels above each other and a three vertical sub-channel part connecting the two horizontal sub-channels electrically.

In FIG. 6c shows an alternative implementation of the transistor in FIG. 6a described by a cross section perpendicular to the substrate surface. A three dimensional embodiment in accordance of the disclosure by stacking layers with two horizontal channel parts above each other and a vertical channel part connecting the two horizontal channel parts electrically is shown in FIG. 6c. The two layers are connected by vertical pillars of semiconducting material, which can be grown for example by epitaxy or from polycrystalline or crystallized amorphous materials. The channel parts are electrically isolated vertically by a dielectric layer (614). As one example a low-k dielectric is used to insulate the channel parts from each other and from the carrier substrate electrically. The gate terminals (632, 633,634) are electrically separated by the gate dielectric layers (604) from the channel (601) and the source and drain terminals (630, 631), which are formed by metal alloy to semiconductor contacts (624).

Figure 6D:
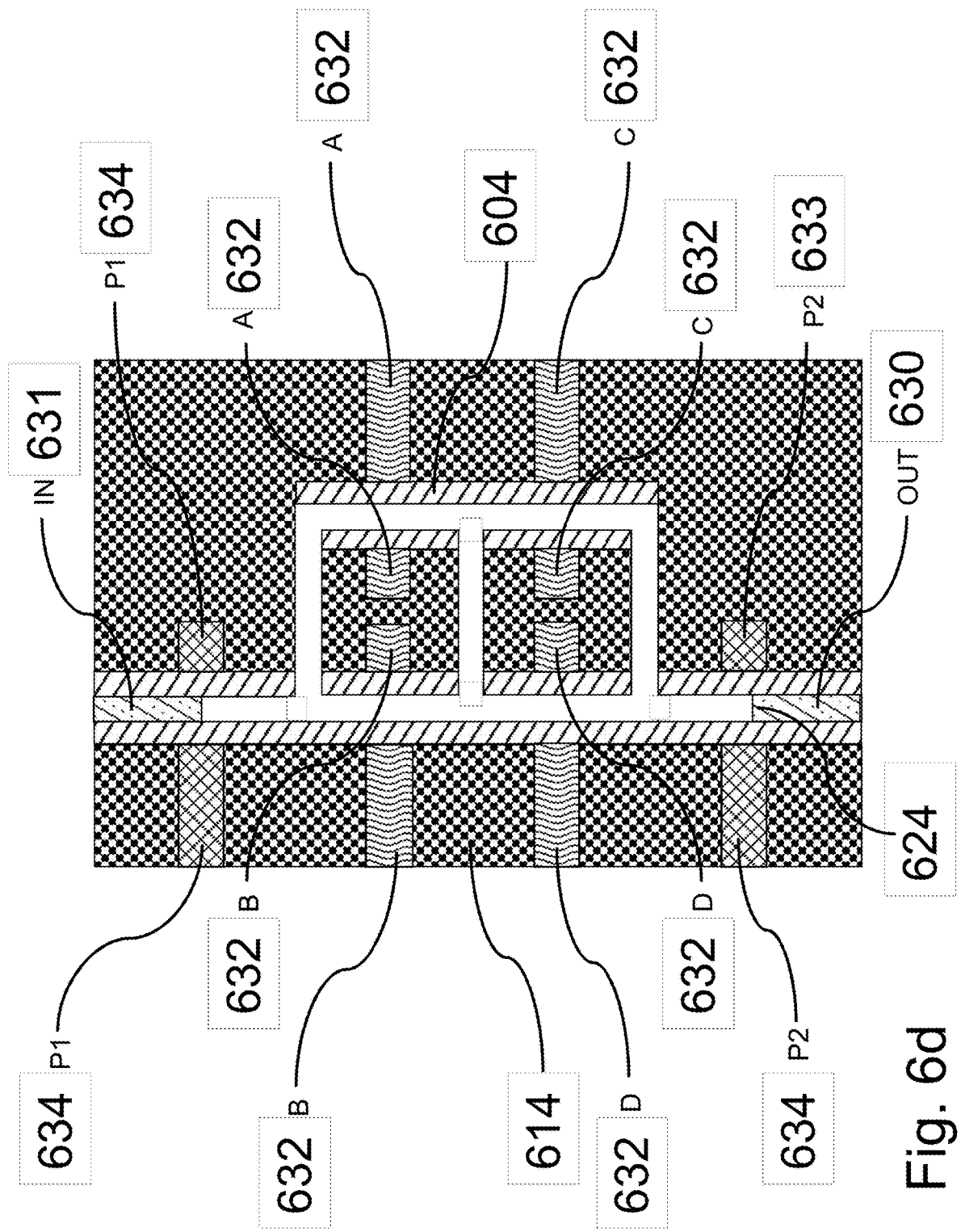
FIG. 6d: An example of the device in FIG. 6c in a vertical cross-section perpendicular to the surface of the substrate.

FIG. 6d shows another example of the semiconductor device structure of FIG. 6c by a cross section. Three horizontal channel layers are stacked onto each other. Vertical pillars of semiconducting material connect the channel parts. All gates surround the vertical channel parts in four layers and are insulated from the channels electrically as an example by high-k dielectrics (604) and low-k dielectrics (614).

Figure 7A:
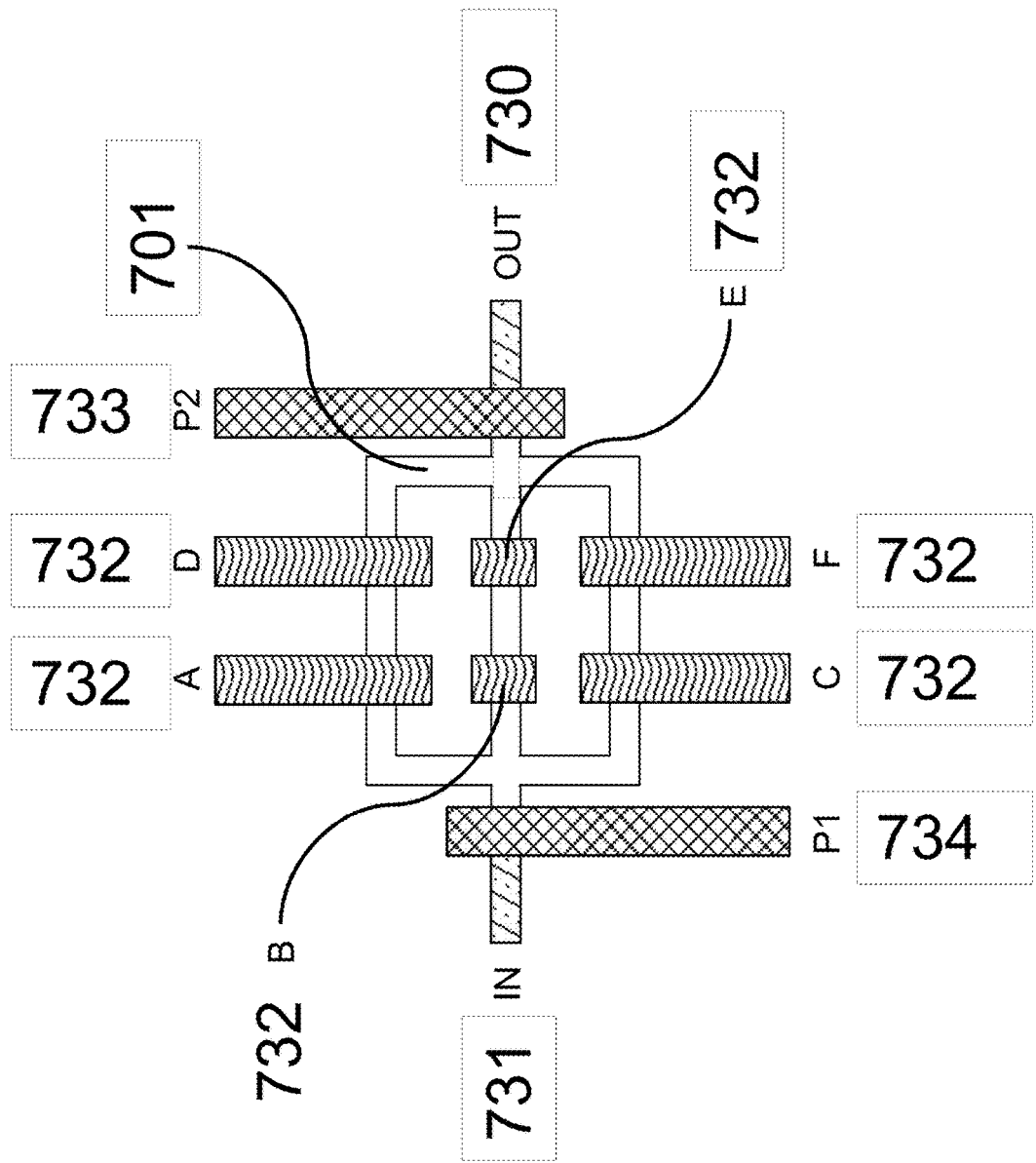
FIG. 7a: Top-view of a transistor, according to one example, forming a logic gate with multiple parallel sub-channels. The gate with multiple branches and vertical contacting of inner gates is achieved by one input terminal IN (731), one output terminal OUT (730) and six independent control gate terminals (732) A, B, C, D, E and F.

FIG. 7a shows a top-view of another example of a transistor, in accordance with the present disclosure, having three parallel sub-channels. The inner gate terminals can be realized by vertical contacting. The transistor with multiple sub-channels (701) connected to the same node and vertical contacting of inner gate terminals is achieved by one input terminal (731) IN, one output terminal (730) OUT and six independent control gate terminals (732), A, B, C, D, E and F. In case of RFETs the gate terminals (734) P1 and (733) P2 are used to set the polarity of the device. A higher amount of functionality can be achieved, if P1 is used as independent control terminal instead.

The binary functionality of the device in FIG. 7a is described by a table in FIG. 7b. The OUT signal is only binary 1, if at least two gates that cover the same channel are at binary 0 and additionally P1 is also at binary 0. For simplicity, the table only lists those states that fulfil this criterion.

Figure 8A:
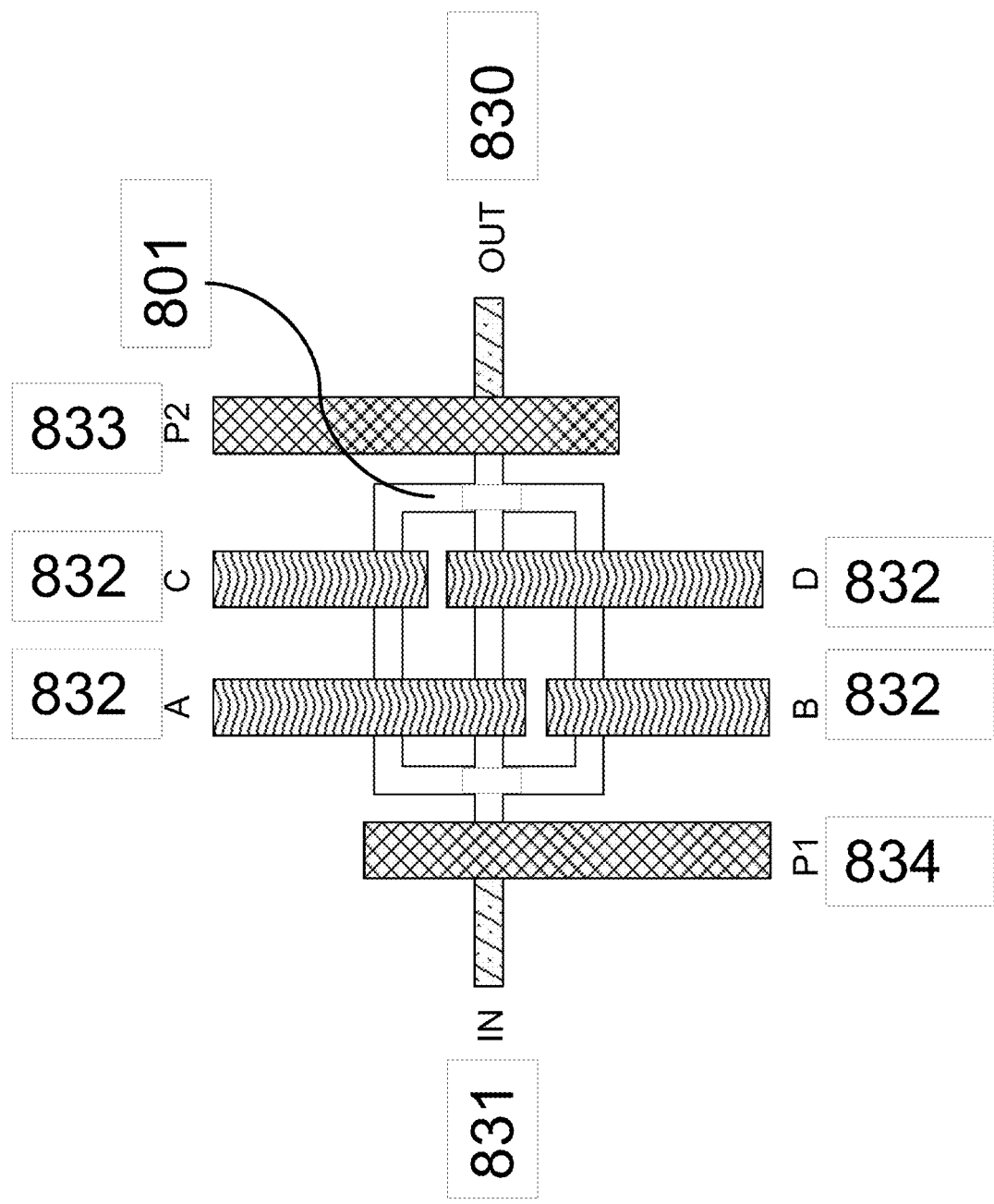
FIG. 8a: Top-view of a transistor forming a logic gate with three parallel sub-channels, according to one example. The device includes one input terminal IN (831), one output terminal OUT (830) and four independent control gate terminals (832) A, B, C and D.

FIG. 8a shows a top-view of another example of a transistor, in accordance with the present disclosure, having three parallel sub-channels (801). The transistor features one input terminal (831) IN, one output terminal (830) OUT and four independent control gate terminals (832) A, B, C and D. In case of RFETs the gate terminal (834) P1 and (833) P2 are used to set the polarity of the device. A higher amount of functionality can be achieved, if P1 is used as independent control terminal instead. The inner channel is gated by gate terminals A and D. This kind of device can be used as pull-up or pull-down network in a 3-MIN or 3-MAJ gate, respectively, if gate B and D have the same signal.

The binary functionality of the device in FIG. 8a is described by a table in FIG. 8b.

Figure 9A:
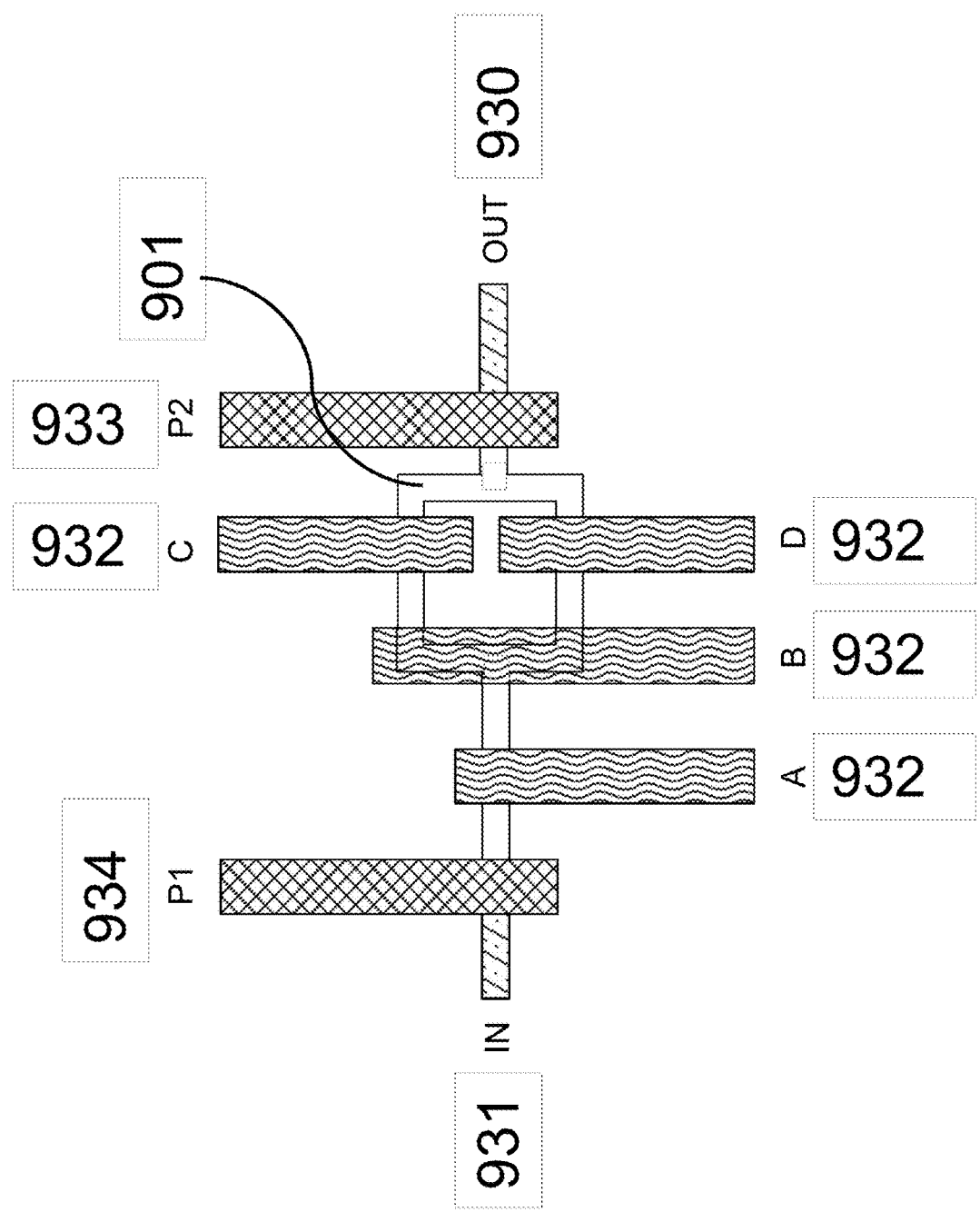
FIG. 9a: Top-view of a transistor forming a logic gate with multiple sub-channels, including parallel and serial structure of sub-channels, according to one example. The complex reconfigurable function integrated within a single active region (901) is achieved by one input terminal IN (931), one output terminal OUT (930) and four independent control gate terminals (932) A, B, C and D.

FIG. 9a shows a top-view of another example of a transistor, in accordance with the present disclosure, having multiple sub-channels, including serial and parallel layouts of sub-channels. The complex reconfigurable function integrated within a single active region, including parallel and serial regions is achieved by one input terminal (931) IN, one output terminal (930) OUT and four independent control gate terminals (932) A, B, C and D. In case of RFETs the gate terminal (934) P1 and (933) P2 are used to set the polarity of the device. A higher amount of functionality can be achieved, if P1 is used as independent control terminal instead. Gate terminal A and B control the sub-channel between P1 and the node. Gate terminal B additionally covers the node where three of the sub-channels are connected in order to save area and prevent potential barrier formation in a long ungated sub-channel segment. Gate terminal C and D both align with one of the parallel independently.

The binary functionality of the device in FIG. 9a is described by a table in FIG. 9b.

Figure 10A:
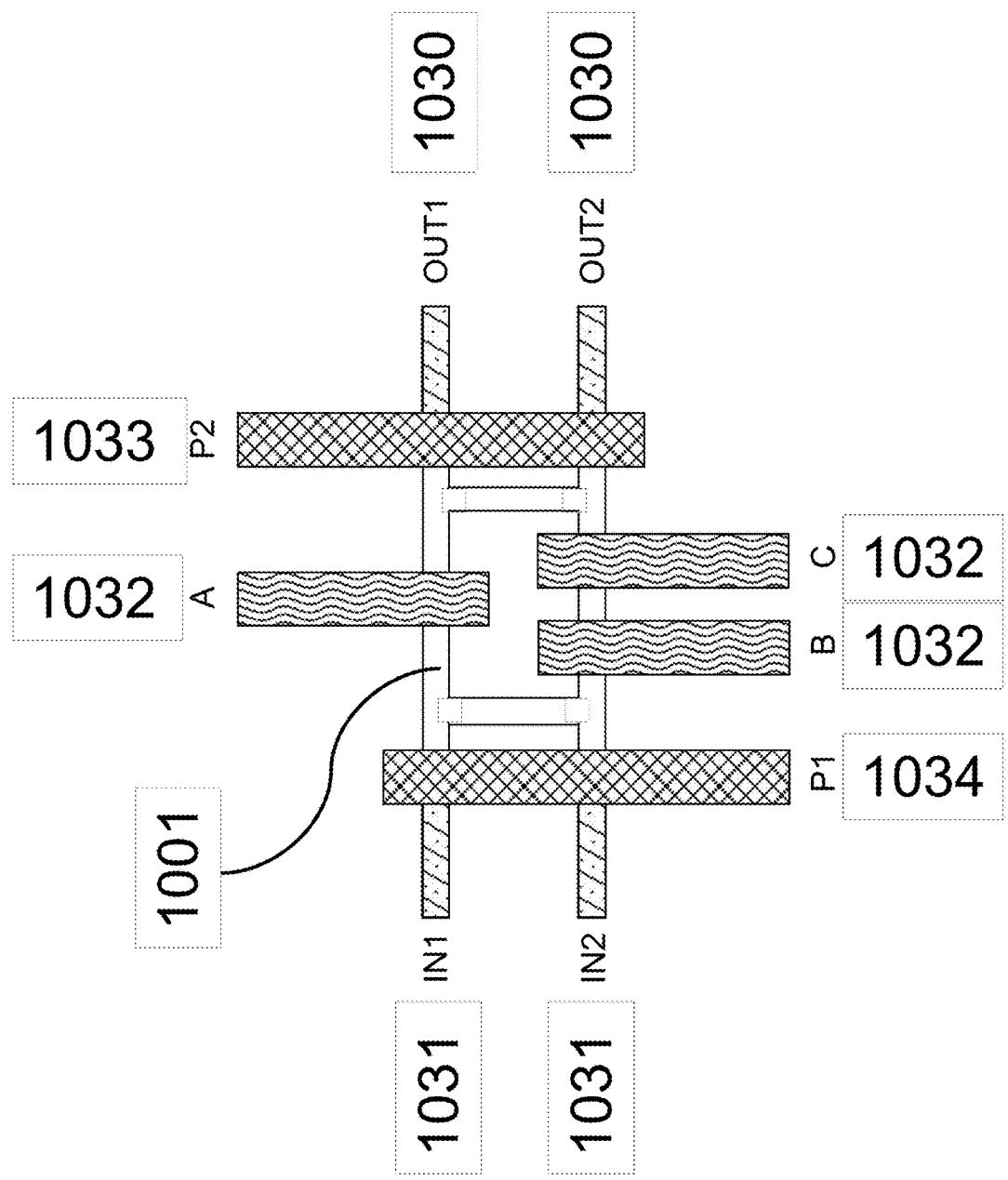
FIG. 10a: Top-view of one example of a transistor structure where a channel region (1001) where eight sub-channel regions with four nodes and four ends is formed. The two input terminals (1031) IN1 and IN2 and the two output terminals (1030) OUT1 and OUT2 each share one of the most outer gates P1 (1034) or P2 (1033) and are connected via two ungated sub-channels.

FIG. 10a shows a top-view of another example of a transistor in accordance with the present disclosure. In this embodiment a channel region (1001) consisting of eight sub-channel regions with four nodes and four ends is formed. The two input terminals (1031) IN1 and IN2 and the two output terminals (1030) OUT1 and OUT2 each share one of the outer gate terminals (1034) P1 or (1033) P2 and are connected via two ungated sub-channels. Therefore, effectively the device has only a single input and a single output but both with increased channel cross section compared to the variant in FIG. 2. Two of the sub-channels have gate terminals (1032) on them and form a parallel network. One of these sub-channels is covered by the gate terminal A, the other one in series by the gate terminals B and C.

FIG. 10b shows the logic table of the device in FIG. 10a. The output of the device is 1 as long as P1 is binary 0 and at least either A or both, B and C, are also binary 0. In all other cases the output is at logic level high resistance (Z). The devices therefore unites an AND operation of inputs B with C, with an OR operation of input A with the AND-conjunction of B and C. In case of RFETs the gate terminal P1 and P2 are used to set the polarity of the device. A higher amount of functionality can be achieved, if P1 is used as independent control terminal instead.

Figure 11:
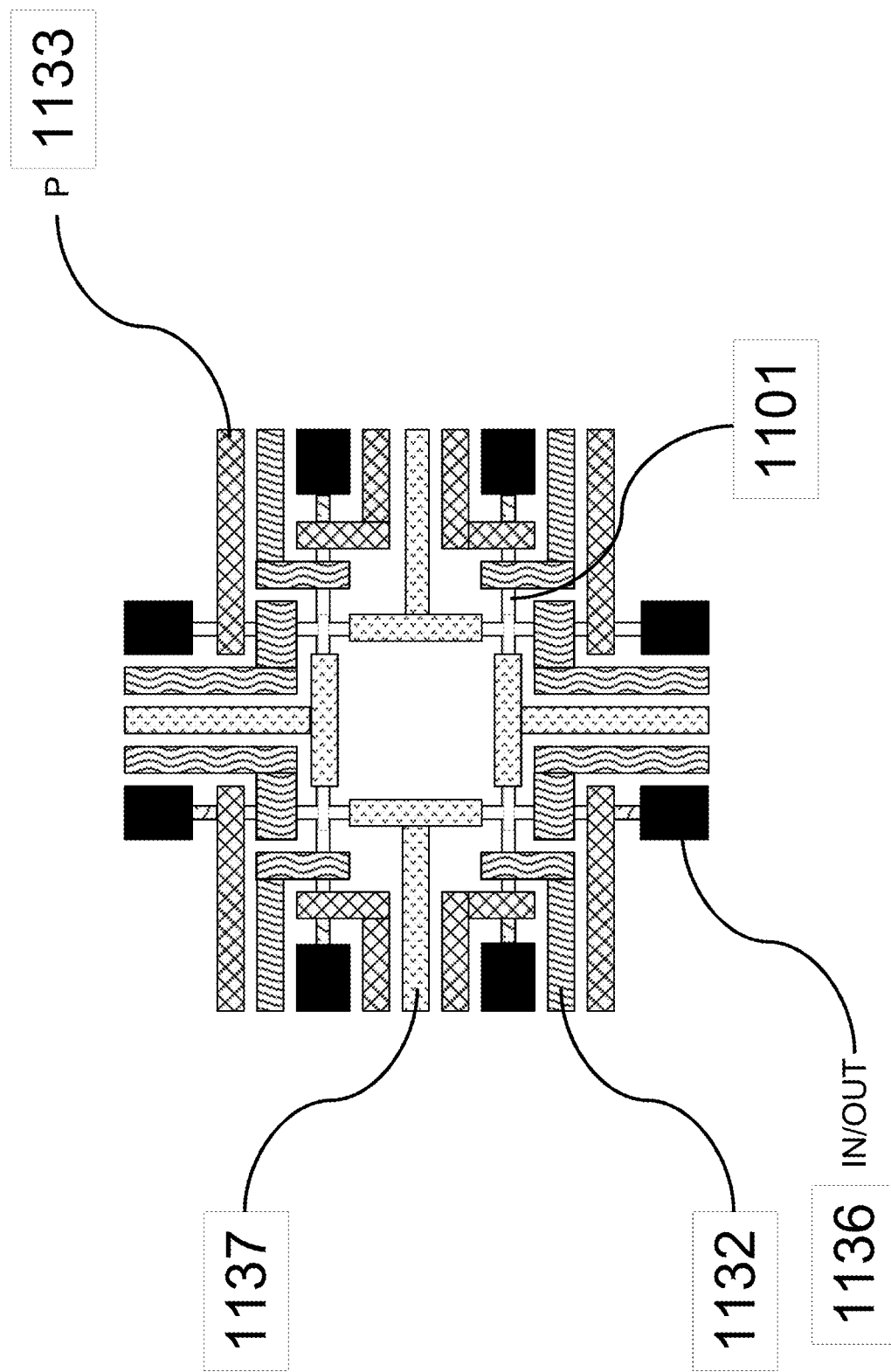
FIG. 11: Top-view of a transistor structure, according to one example, including a gate with multiple sub-channels, four forming an inner ring and eight branching off to the IN/OUT terminals. The example structure contains 20 gates of which 8 are program gates close covering the contact regions.

FIG. 11 shows a top-view of another example of a transistor, in accordance with the present disclosure, having a channel (1101) of multiple sub-channels connected by four nodes such that an inner ring and eight connections to the IN/OUT terminals (1136) are formed. The structure contains 20 gate terminals of which 8 are program gate terminals (1133) which are near to the contact regions. The eight outer sub-channels between the IN/OUT terminals and the central sub-channel ring are each covered each by a program gate terminal and a control gate terminal (1132). Additional four gate terminals (1137) each cover a single one of the four sub-channel segments of the inner ring structure. These gates allow to divide the device into one up to four electrically separated structures.

Figure 12A:
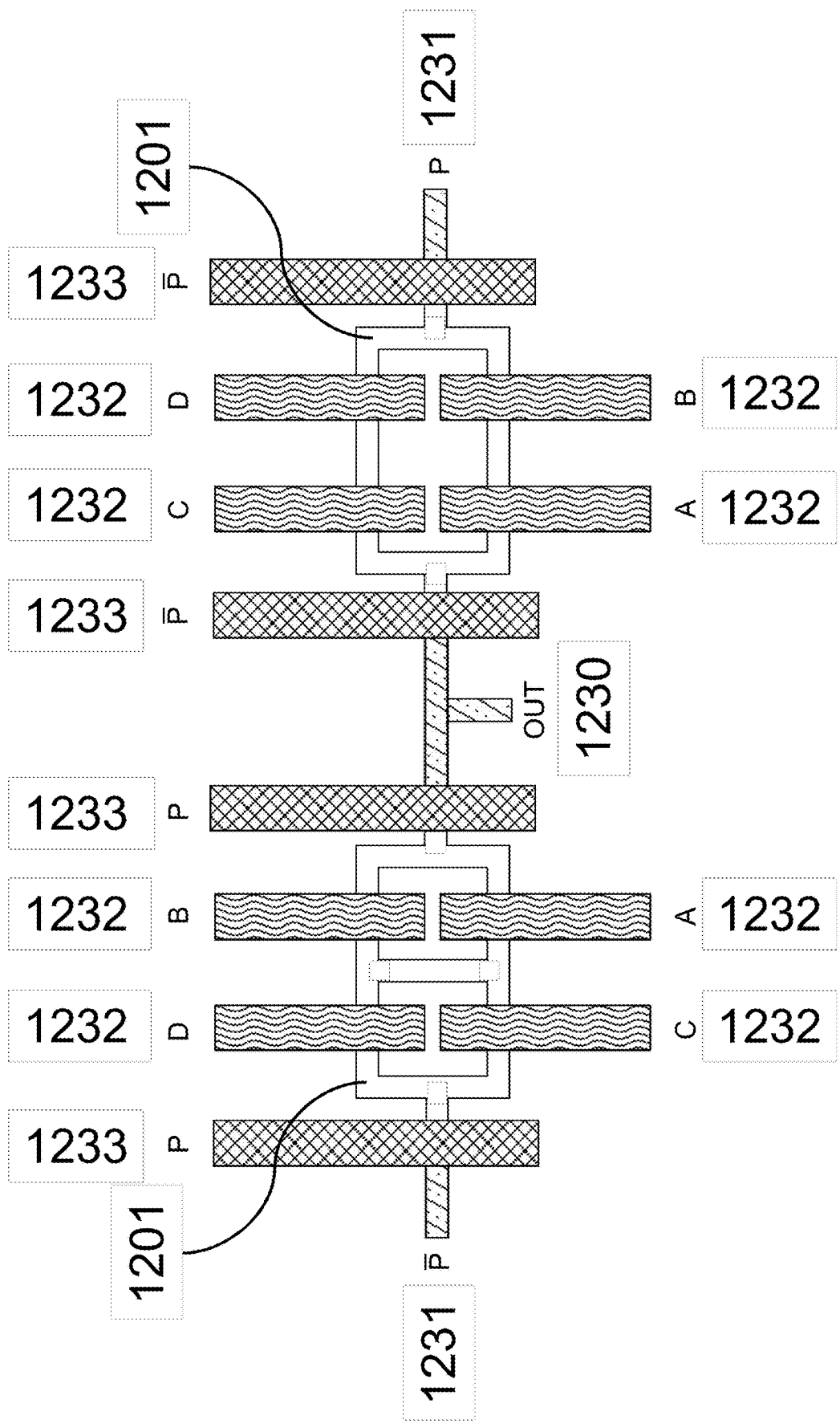
FIG. 12a: Top-view of an example integrated circuit built from two transistors with shared OUT terminals. The outer contact of the devices are supplied with P and NOT(P), respectively. Program gates at the respective circuits have the inverted signals NOT(P) and P. Four input signals A, B, C and D are applied to the circuit.

FIG. 12a shows a top-view of an integrated circuit of two transistors, according to the present disclosure, both having a separate channel (1201) each with shared OUT terminal (1230). The outer contact terminals (1231) of the devices are supplied with P and NOT(P), respectively. Program gate terminals (1233) at the respective circuits have the inverted signals NOT(P) and P. Four input terminals (1232) A, B, C and D are applied to the circuit. The function of the individual transistors changes in dependence of the signal of P. For P at binary 0, the circuit works as OR-AND-Invert logic gate (OAI), for P at binary 1, the circuit works as AND-OR-Invert (AOI) logic gate. The binary functionality of the circuit in FIG. 12a is described by a table in FIG. 12b.

Figures 13A, 13B:
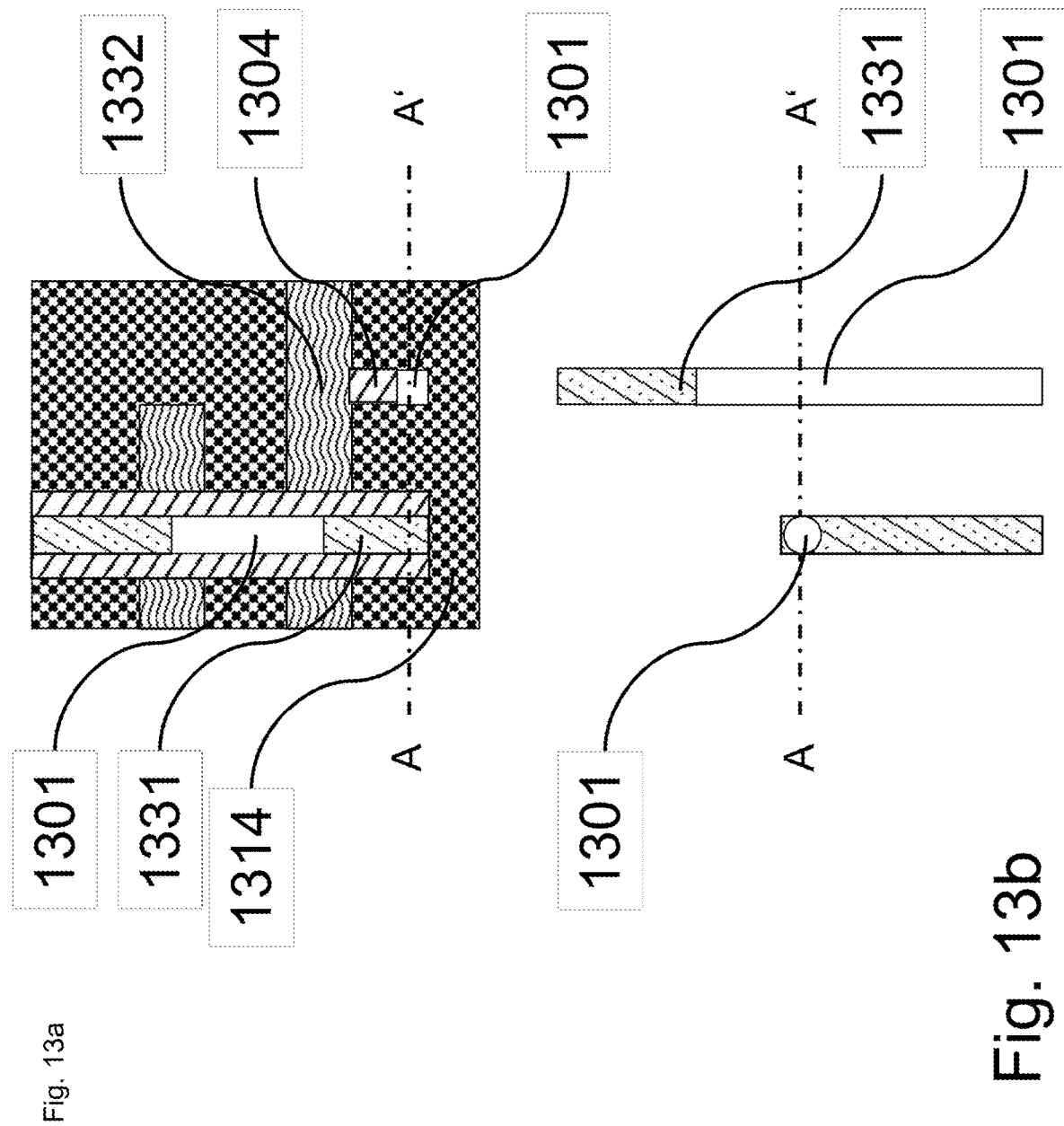
FIG. 13a: Cross section view of an integrated circuit with mixed vertical and horizontal channels, according to one example.
FIG. 13b: Top-view view of the circuit in FIG. 13a along the vertical cut axis A-A'.

Multiple combinations of horizontal and vertical channels and channel parts can be realised depending on the functionality needed for each specific application. As an example FIG. 13a shows an n integrated circuit with mixed vertical and horizontal channels and channel parts (1301), input/output terminals (1331) gate terminals (1332). The channels and channel parts are electrically isolated vertically by a dielectric layer (1314), preferably a low-k dielectric. The gate terminals (1332) are electrically separated by the gate dielectric layers (1304) from the channel (1301).

FIG. 13b is a cross section of the integrated circuit in FIG. 13a along the cut axis A-A'. The vertical channel part of one transistor is gated with two surrounding gate terminals. The lower gate terminal overlaps with the neighbouring lateral channel part of another transistor. Therefore one gate terminal is shared between a vertical and a planar channel parts of two transistors of the integrated circuit.

Figure 14A:
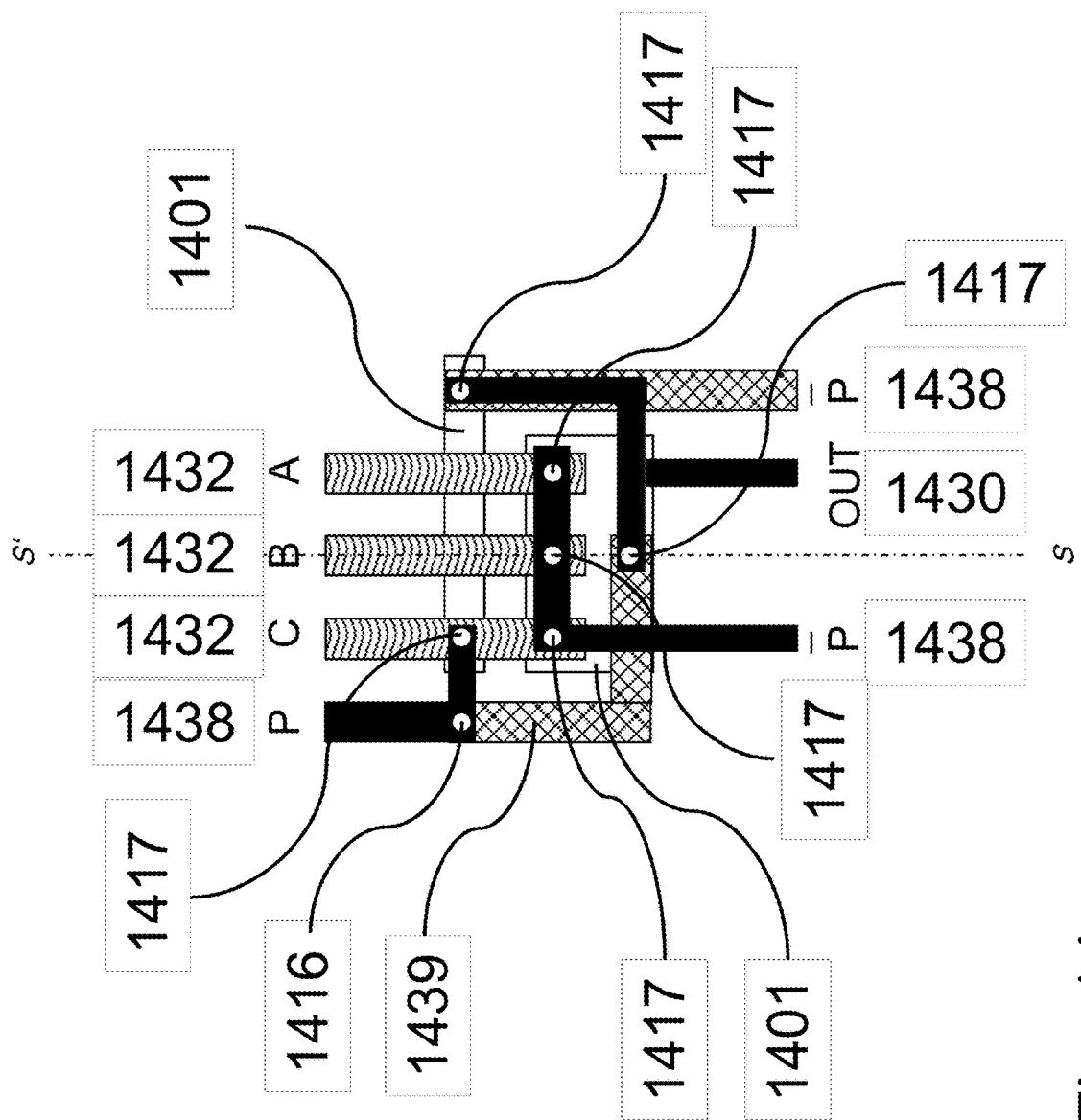
FIG. 14a: Top-view of an example implementation of an integrated circuit of a binary logic gate with the inputs A, B and C that can be switched to work as a NAND gate for P at binary 0 and as NOR gate for P at binary 1.

FIG. 14a shows a top-view of an integrated circuit of two transistors according with this disclosure. Both are the implementation of a binary logic function at the output terminal (1430) which can be switched between performing the NAND function of the signals at the input gate terminals (1432) A, B and C for P at binary 0 and performing the NOR function, respectively, for P at binary 1.

The metal contacts (1417) and wire lines (1416) are used for multiple terminals with common potential. The efficient design distributes the input signals A, B and C to the respective gate terminals (1432) as well as the program signals P and NOT(P) to the respective gate (1439) and source terminals (1438) without area overhead for routing input signals between pull up and pull down networks. A shared planar gate to vertical gate contact at gates B and C enables these direct signal routing geometries. In one embodiment, the cell size needed is 10×10 $F^2$ including area for side isolations.

Figure 14B:
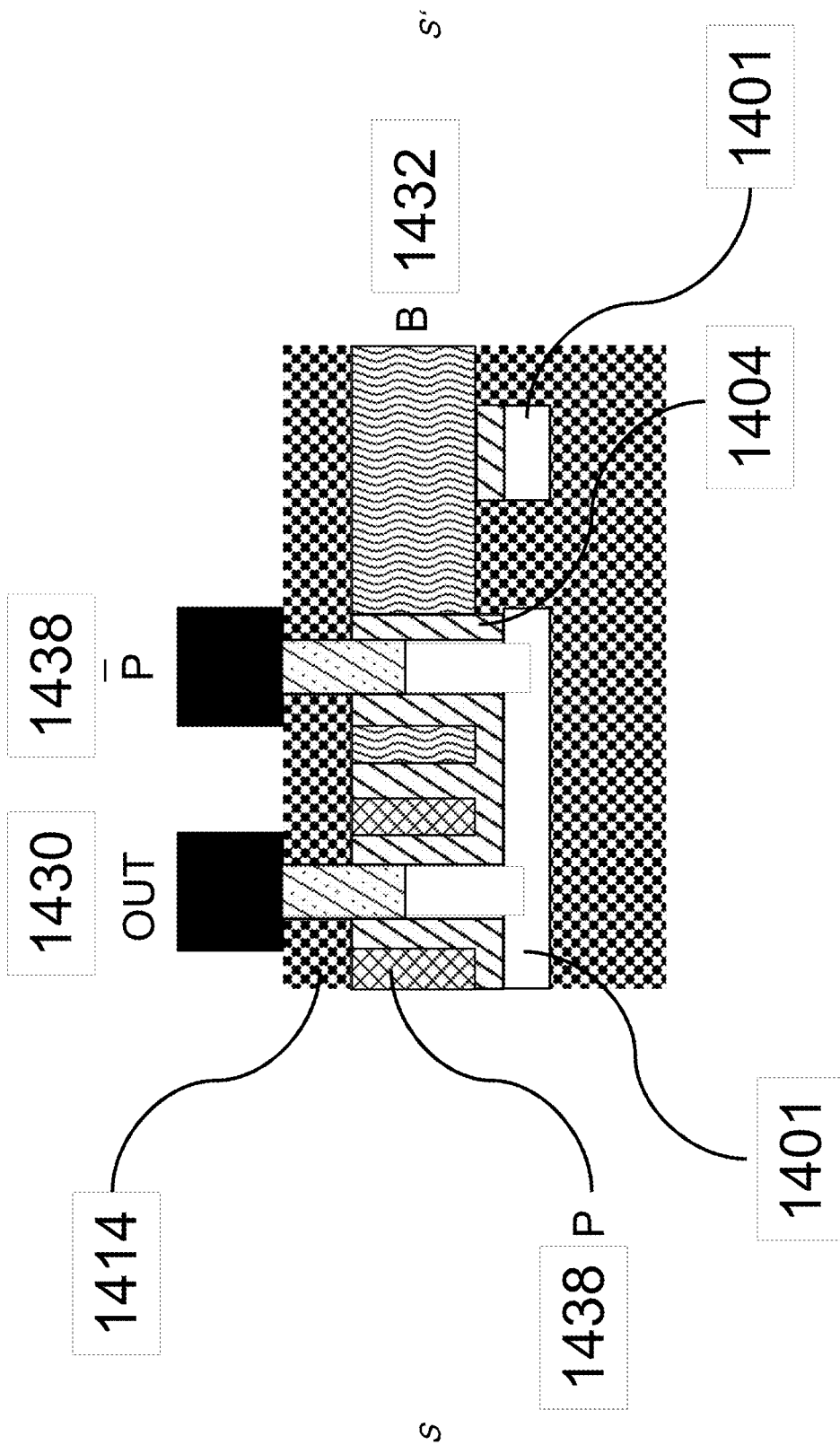
FIG. 14b: Cross section-view of the circuit in FIG. 14a along the vertical cut axis S-S'.

FIG. 14b shows a cross-view of an integrated circuit of two transistors according with this disclosure shown in FIG. 14a along the cut axis S-S'. Two gate terminals (1433) surround vertical sub-channels, of a channel with vertical and horizontal parts (1401). The channel parts are isolated by gate dielectrics (1404) from the gate terminals. One of the gate terminals extends above the neighbouring planar channel part of the second transistor and covers it. Thus, this gate is shared between a vertical and horizontal channel. The channel parts are electrically isolated by a dielectric material (1414), preferably a low-k dielectric. The binary functionality of the circuit in FIG. 14a is described by a table in FIG. 14c.

In one example, the disclosed transistor is built from three individual gate terminals on top of a single straight semiconductor channel having no nodes or junctions, as described hereafter. The following detailed description is given by way of example of the formation of a structure and not intended to limit the disclosure solely thereto. In a different embodiment, the disclosed transistor is built from four or more individual gate terminals on top of a semiconductor channel of four or more semiconductor sub-channels with two nodes and two ends, as described hereafter. In general, both, the number of sub-channels and the resulting shape of the semiconductor channel region are arbitrary. The general case of having multiple sub-channels will best be appreciated in conjunction with the accompanying drawings, wherein like reference numerals denote like elements and parts.

In accordance with the present disclosure, the following detailed description is giving of an integrated circuit comprises a transistor comprising a semiconductor channel comprising one or more nodes connecting three channel parts electrically. In one embodiment Schottky contacts are formed at each end of the channel and gate contact are positioned to control the Schottky barrier type of each Schottky contact of the channel. Further the channel comprises more than one gate contact to control the conductivity of a channel. In other embodiments the following detailed description is giving the formation of the transistor channel comprising one or more nodes connecting three or more channel parts electrically and Ohmic contacts are formed at each end of the channel. One or more gate contacts are positioned to control the conductivity of one channel part or are positioned to control the conductivity of a channel part.

Also in accordance with the present disclosure, the integrated circuit includes a semiconductor transistor with two or more gate electrodes structured above a lateral semiconductor channel. All gate contacts are electrically isolated by dielectric spacer material from each other and have no electrical contact to the channel between the individual gate electrodes. The structure includes raised semiconductor areas, which are separated from the spacers of the most-outer gate structures; which have a metal-semiconductor alloy at each end of the channel ends and on top of the raised areas and between the raised areas and the most-outer gate structures. The metal alloy forms either Schottky contacts or ohmic contacts at all channel ends.

In one example of the present disclosure, the integrated circuit comprises a semiconductor transistor with a semiconductor channel and an isolating dielectric material above the semiconductor channel. Two or more gate contacts are positioned above said isolating dielectric material. Electrically all gate contacts are separated from each other by a dielectric spacer material. Raised semiconductor areas are separated by the spacers from the most-outer gate structures and a conductive material is formed adjacent to said raised areas until each channel end. The conductive material is forming Schottky barrier contacts positioned below the most-outer gate contacts.

In another example, the conductive material is forming an Ohmic contact. The conductive material is of a metal-alloy, preferably.

An illustrative method disclosed herein includes providing a semiconductor structure for as one example a transistor of an integrated circuit comprising three or more gate contacts and comprising one or more nodes connecting three channel parts electrically. The semiconductor structure comprises a semiconductor channel material and a gate stack, said gate stack comprising a transistor dielectric over said channel material and a top electrode material over said transistor dielectric (1504, 1604, 1704) structured into three or more gate structure each gate structure electrically isolated by dielectric spacer materials finally being processed to a gate electrode or more complex a gate terminal. In another embodiment said gate stack comprises a gate insulation material over said substrate, a channel material over said gate insulation material, a transistor dielectric over said channel material and a top electrode material over said transistor dielectric structured into three or more gate structure each gate structure electrically isolated by dielectric spacer materials finally being processed to a gate electrode or gate terminal.

A first masking material is performed. This first masking material masking the gate structure and defining an area beside said gate structure. The method further includes the transistor dielectric material beside of the areas protected by the masking material. The method of processing of the transistor further includes an epitaxial growth on the channel materials of the transistor forming raised source drain areas where the transistor dielectric has been removed.

The masking material is removed. In other embodiments it is of advantage having the masking material left between the gate structures. Such methods include a partly removal of the masking material such that masking material is removed completely besides areas between the gate structures such that masking material is still present between the gate structures.

An electrically conductive material is deposited. In some examples, a metal is used as conductive material deposited. A metal semiconductor alloy on top of the epitaxial grown areas and of the channel material under the outer gate structures is formed by subsequent annealing steps forming a Schottky or Ohmic contact under the outer gate structure. Portions of the electrically conductive material not being alloyed are removed. In other embodiments it is of advantage forming a metal alloy on top of the gate structure in parallel to forming a metal alloy onto of the epitaxial grown areas and of the channel material. For such application the method includes comprising the formation of a metal semiconductor alloy on top of the semiconductor gate structure.

In another example, it is of advantage to remove the gate metal or gate poly silicon as well as the gate dielectric material after the metal-alloy formation at source and drain, without a removal of the isolating material between two individual gate structures. This step is followed by a high-k dielectric deposition onto the opened channel parts and subsequent deposition of a new gate metal deposition above said high-k dielectric.

Within a further illustrative method disclosed herein, the semiconductor transistor comprises a semiconductor substrate and a stack, said stack comprises a gate insulation material over said substrate and a channel material over said gate insulation material. A first masking material is masking the said channel material over said gate isolation material in defined areas. Further the method includes an epitaxial growth on said channel materials of the transistor not masked by said masking material forming raised source drain areas. An electrically conductive material is deposited. In specific embodiments a metal is used as conductive material deposited.

A metal semiconductor alloy on top of the epitaxial grown areas and of the channel material under the outer gate structures is formed by subsequent annealing steps forming a Schottky or Ohmic contact under the outer gate structure. Portions of the electrically conductive material not being alloyed are removed. The masking material is removed. The method includes further processing of a gate structure out of a gate stack on top of the metal semiconductor alloy and the channel material such that gate structure are positioned above said Schottky contacts formed between the metal alloy and the channel electrode material.

Finally the processing of the integrated circuit is concluded by methods known for someone skilled in the art.

In one example, processing of the device or a plurality of the devices, in accordance with the present disclosure, uses a planar semiconductor substrate or wafer (1503) (FIG. 15). In other embodiments the processing of the device as described by the disclosure uses pre-processed substrates which include already other different devices like CMOS transistors or diodes partially covering the substrate. The semiconductor substrate can be Silicon (Si), Germanium (Ge), tin (Sn), a mixture of those materials or III-V materials like GaAs.

Figure 15A:
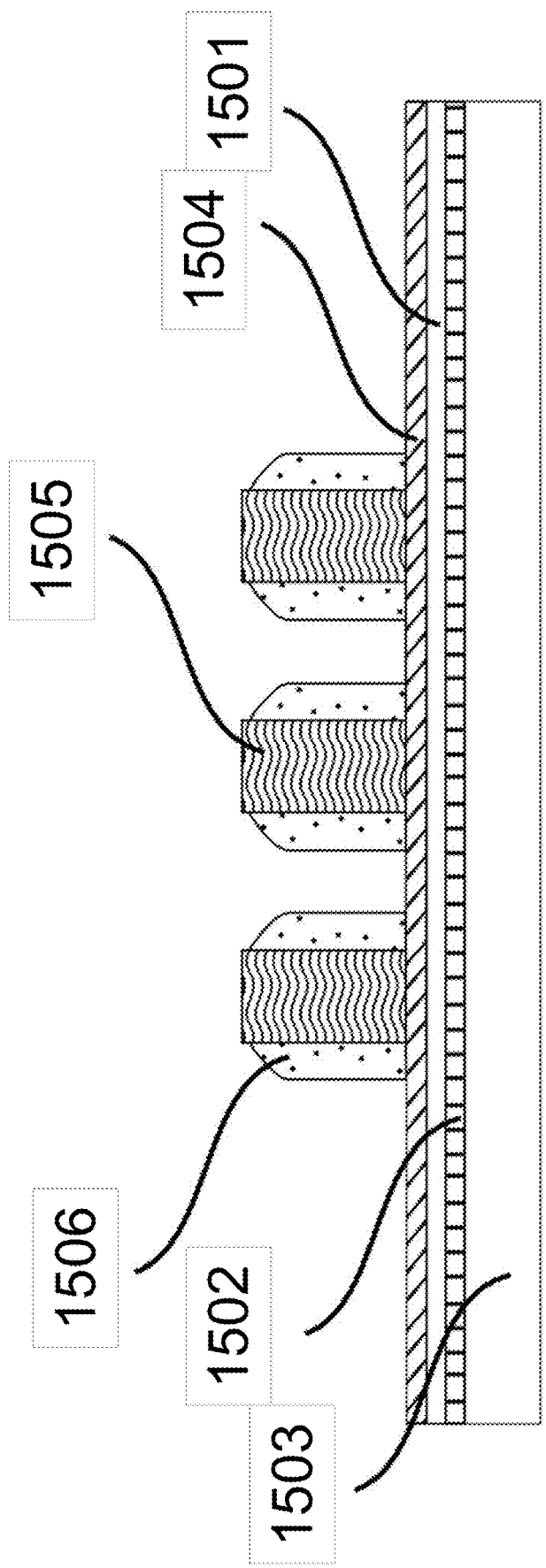
FIG. 15a: Cross-section view depicting formation, according to one example, of three gate terminals on a substrate comprising at least a first semiconductor channel region (1501) atop a dielectric layer (1502) atop a semiconductor body (1503).

FIG. 15*a* is a cross-section view depicting formation of multiple (here three) gate terminals on a substrate comprising at least a first semiconductor channel region (1501) atop a dielectric layer (1502) atop a semiconductor body (1503). A gate terminal thereby comprises of a metal or semiconductor contact (1505) with two adjacent dielectric spacers (1506), which are isolated to the channel region by at least one dielectric layer, typically a high-k dielectric (1504). The channel portion between two gate terminals is passivated by the same dielectric layer. The individual gate terminals are isolated to each other by some spacing.

At the surface of the substrate a channel region (1501) is present. The semiconductor channel region can be Silicon (Si), Germanium (Ge), carbon (C), tin (Sn), a mixture of those materials, III-V materials like GaAs or layered materials such as Graphene or $MoS_2$. The channel region can be single crystalline, poly crystalline or amorphous. The channel region is processed atop a buried oxide or electrically isolating layer (1502). The buried oxide layer (1502) can be achieved by ion implantation of ions below the surface followed by a thermal treatment e.g. with rapid thermal processing (RTP). By processing with RTP the buried oxide layer (1502) is formed and adjacent to this layer between the buried oxide and the substrate surface a channel (1501) is formed. In another embodiment the buried oxide layer is processed by epitaxial growth of an electrically isolation layer (1502). Afterwards the channel is grown by epitaxial growth or by another deposition technique like CVD deposition and former annealing e.g. with RTP.

On top of the channel (1503) the gate dielectric (1504), typically an oxide, is processed. In another embodiment depending on the requirement of the device as described with this disclosure no gate oxide is required and therefore no gate oxide is processed. In other applications known the gate oxide is processed after the formation the electrical isolation often named spacer (1506) of the gate contacts (1505). Different technologies are available for processing of the gate oxide (1504) if needed or of advantage. One technology is wet oxidation of the channel material by a thermal process. Other technologies are CVD or ALD deposition if required followed by a thermal process like RTP. The gate dielectric material can be one out of $SiO_2$, $Si_xN_y$, $Al_2O_3$ and $HfO_2$, $GeO_2$ or $TiO_2$. It can be a layer stack of materials especially those named. And different dopants are available like Si, Zr, Y, Sr, F and La.

In one example of the present disclosure, processing of the channel region is done. The top-view shape of the arbitrary channel region is structured by photo lithography or other suitable technologies and transferred to the channel region via an etching process. The etching process can be by wet etching dry etching like reactive ion etching (RIE) or atomic layer etching (ALE) and removes the gate oxide in the area where it is not needed for further forming the device. In another embodiment of the devices of this disclosure the structuring of the channel region is done after the formation of the gate contacts (105) and the electrical isolation of the gate contacts often named as spacer (1506).

Subsequently in a following step, individual gate contacts (1505) are pattered depending of the specific embodiment of this disclosure on top of the not-structured or structured gate oxide. The gate terminal itself can be formed either in a gate-first or gate-last in scheme. A small distance between the individual gates can be achieved by photo lithography technologies known as double (or quad) patterning approaches, such as double exposure, litho-etch-litho-etch or self-aligned double patterning. Other approaches are with EUV or X-ray lithography. An etch-stop on the gate oxide (1504) has to be realized to prevent damaging of the channel region between the individual gates. The gate terminal isolated by self-aligned spacers (or gate spacers) adjacent to the gate terminal is normally perpendicular to the substrate surface. Two neighbouring gate spacers can be processed such that no space is in between, if it is of advantage for the device described with this disclosure. The spacers are typically made of $Si_xN_y$ or $SiO_2$.

Figure 15B:
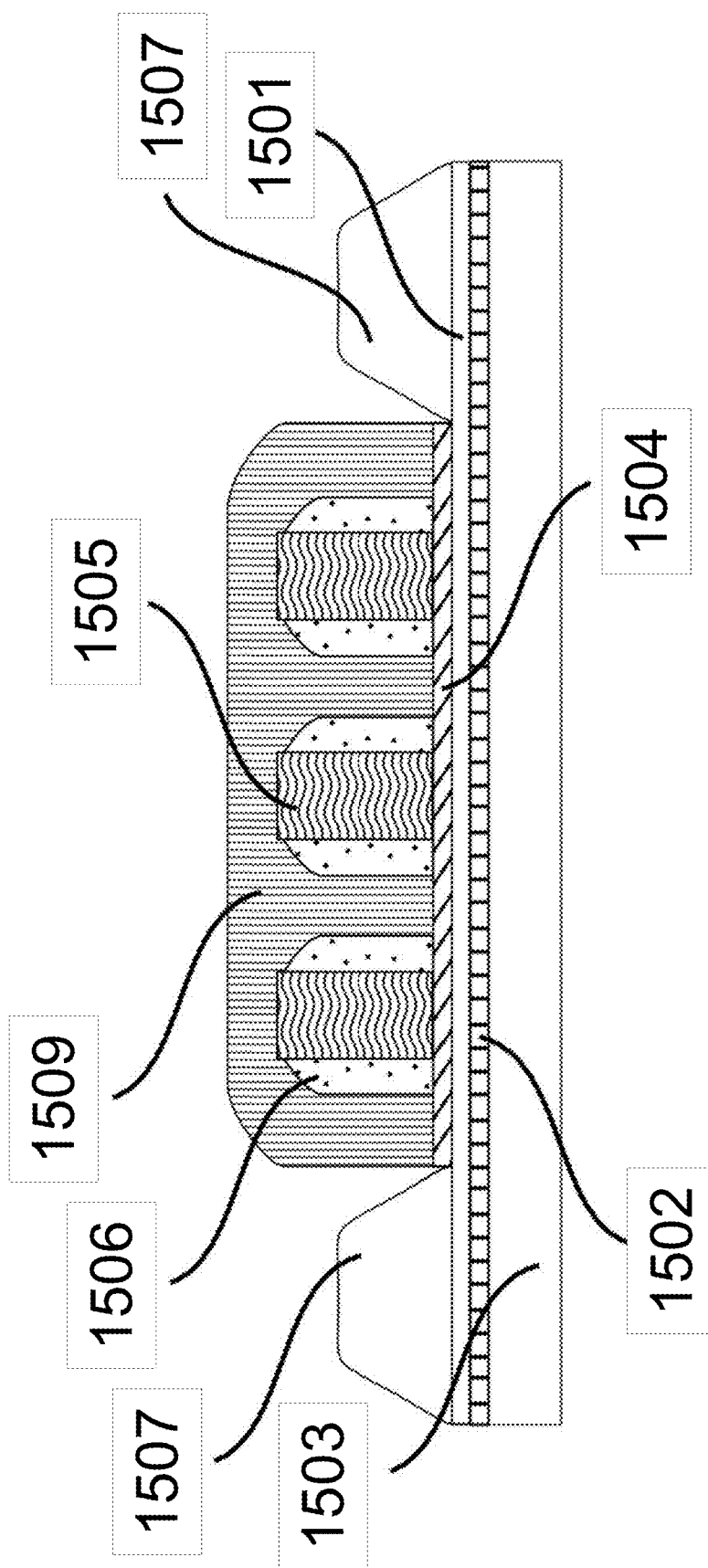
FIG. 15*b*: Cross-section view depicting selective formation, according to one example, of raised semiconductor material on opposing sides of the most outer gate structures, whereby the raised source and drain regions (1507) are not in direct contact to the gate contact (1505) or its adjacent dielectric spacers (1506).
Figure 15C:
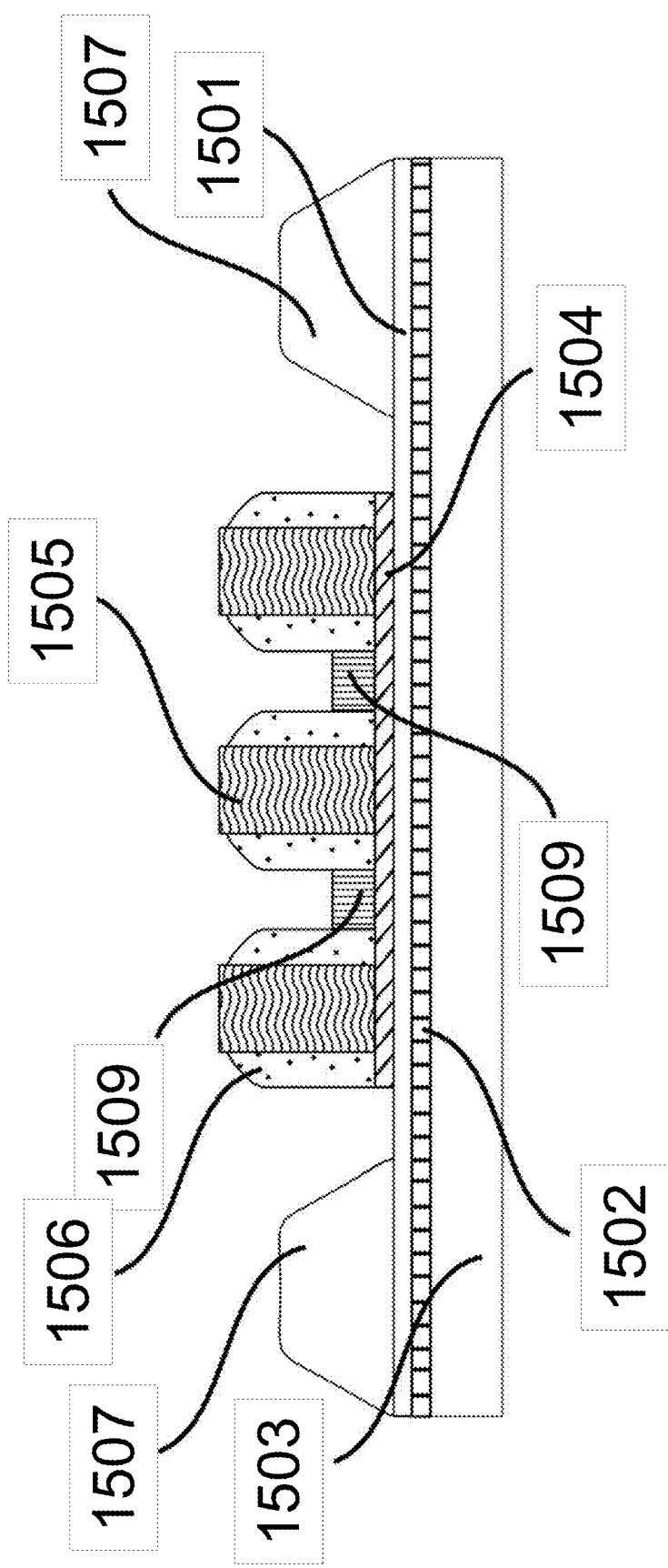
FIG. 15*c*: Cross-section view depicting selective formation, according to one example, of raised semiconductor material on opposing sides of the most outer gate structures, whereby the raised source and drain regions (1507) are not in direct contact to the gate contacts (1505) or its adjacent dielectric spacers (1506) after the additional spacer is partially removed.

In one example of the present disclosure, after formation of the gate terminals, raised source and drain areas (1507) will be processed by epitaxial growth of Si or SiGe on the semiconductor surface channel (FIG. 15*c*). In another embodiment of this disclosure especially if technologies are used where in the gate terminal is processed after processing of the isolating gate spacers the processing of the gate terminal is after processing of the source and drain contacts. Processing of the epitaxial grown Si or SiGe is done by high temperature CVD processing or similar technologies. The thickness of the raised source and drain areas depend on the requirements of the overall technology requirements and vary between some atom layers up to 100 nm or more. The diameter of the raised source and drain areas depends of the overall technology requirements used for the circuit processing. Typical diameter are 50 to 250 nm.

FIG. 15*b* is a cross-section view depicting selective formation of raised semiconductor material on opposing sides of the most outer gate structures, whereby the raised source and drain regions (1507) are not in direct contact to the gate terminal or its adjacent dielectric spacers (1506). In this embodiment this is realized by an additional single spacer (1509), reaching over all gate terminals prior to the epitaxy forming the raised source and drain contacts for source and drain contact.

One advantage of the transistors of the present disclosure are the source and drain contacts (1524), which in this example are created by a lateral metal to semiconductor alloy (1523) formation along the channel parallel to the surface of the substrate. In other embodiments the lateral metal to semiconductor alloy formation is still along the channel in this case perpendicular to the surface of the substrate, if the channel region is formed perpendicular to the surface of the substrate.

In one example, processing of the source and drain areas (1507) continues with a photo lithography step followed by a wet or dry etching process to open the source and drain contact area such that the channel layer (1501) between the source and drain areas (1507) and the spacers (1506) of the outer gate contacts (1505) are accessible from the top. The processing and layout has to be done such that later the source and drain contacts (1524) are located close to the respective gate terminals as needed and described with this disclosure.

Therefore the process of forming the lateral metal to semiconductor alloy later on has to start near the semiconductor channel below the typically used raised source and drain epitaxial regions at the most outer gates of the structure in order to provide high controllability and reliability (FIG. 15*b*). This requirement can be realized by a local separation of the raised source and drain epitaxial regions. In some embodiments the separation of the source and drain epitaxial areas can be done by a block mask or a self-aligned block spacer (1509) covering all gates of the transistor. In the embodiment described with this processing the number of gate covered by the block mask or the self-aligned block space is of an unequal number of gate terminal in a row, allowing of processing especially of devices as described by this disclosure using an unequal number of gate terminal. Typical materials used as block masks are e.g. $SiO_2$, $Si_xN_y$, $Al_2O_3$, $HfO_2$, $ZrO_2$, photo resist based masks or combinations out of such materials.

Simultaneously, a contact filling or alloy formation between the separate gates of a single transistor has to be prevented. In some embodiments the prevention of the contact filling can be done by a block mask or a self-aligned block spacer covering all gates of the transistor. The same spacer of block mask can be used to achieve both effects simultaneously. Subsequently, the gate dielectric in the defined source drain areas is removed by wet or dry etching as described before and an epitaxial growth of semiconductor material can be used to form raised source and drain areas. Materials used to form the raised source and drain areas in case of substrates used out of Silicon are e.g. Silicon, Ge, SiGe or SiC. If substrates out of Germanium are used the raised source and drain materials are out of e.g. Ge or GeSi. If substrates out of GaAs materials like GaAs are used. The raised source and drain areas (1507) are processed e.g. by epitaxial growth or CVD processing followed by thermal annealing.

In another example, the raised source and drain contacts are formed prior to the gate terminal as described before. In this case the spacing needed between the raised source and drain contacts and the gate terminal is achieved by an appropriate design or layout of the devices or circuit.

A subsequent wet etch or isotropic dry etch is used to remove the block spacer above the channel in the area between the source and drain region and the most outer gates FIG. 15c. Preferably, this process is not removing the full spacer in the area between individual gates as it is of advantage for the devices described in this disclosure. Thus protecting the gate oxide or dielectric (1504) to channel interface within the ungated region between the individual gates from etch damage the block mask is partially left (1509) as shown in FIG. 15c.

FIG. 15c is a cross-section view depicting selective formation of raised semiconductor material on opposing sides of the most outer gate structures, whereby the raised source and drain regions (1507) are not in direct contact to the gate terminal or its adjacent dielectric spacers (1506) after the additional spacer is removed. In this embodiment this is done by an isotropic etching process removing the gate dielectric (1504) from the channel portion between the raised source drain regions (1507) and the spacers (1506) of the most outer gate terminals. Simultaneously the gate dielectric (1504) between two individual gate terminals is protected by the residual of the dielectric spacer (1509).

Figure 15D:
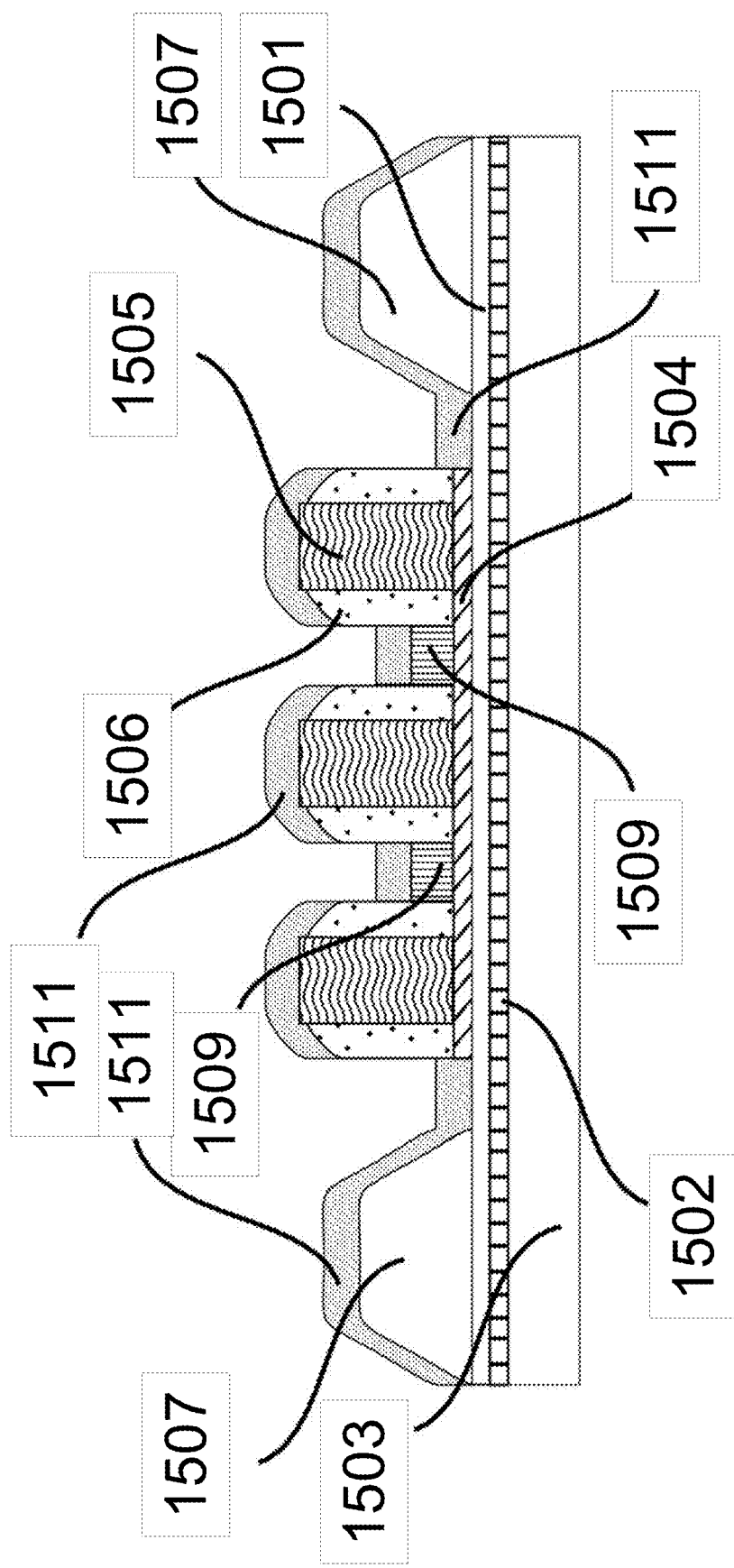
FIG. 15*d*: Cross-section view depicting, according to one example, the deposition of a metal-containing layer (1511) on the whole structures, including the raised source and drain areas as well as the gate terminals, whereby a direct metal to channel contact is achieved in the area between each of the outer gate structures (1505) and the raised source drain region (1507), but no metal to semiconductor contact is formed in the semiconductor channel region below the protection residual of the spacer (1509) between the gate structures.

In a following step, a self-aligned metal semiconductor alloy formation is conducted FIG. 15d. The whole structure is subjected to the deposition of a metal layer (1511). The deposition can be either conformal or directional. Typically, a PVD process, such as sputtering or evaporation is used. CVD or ALD processing is usable too, especially if higher conformation rates are of interest. Materials used are metals preferable forming silicide like Ni, Co and Ti in case the channel material is of Silicon. In case the channel is of Germanium materials forming an alloy with Germanium like Ni, Mn, and Cu can be used. In case the channel is of GaAs materials forming an alloy with GaAs are use e.g. Cr, Ni, Co or mixtures of those materials. In all embodiments described additional elements, such as Pt or Al can be added to the alloy to vary the structural stability or electrical properties of the metal semiconductor alloy.

FIG. 15d is a cross-section view depicting the deposition of a metal-containing layer (1511) on the whole structures, including the raised source and drain areas as well as the gate terminals, whereby a direct metal (1511) to channel (1501) contact is achieved in the area between each of the outer gate structures (1505) and the raised source drain region (1507), but no metal to semiconductor contact is formed in the semiconductor channel region below the protection residual of the spacer (1509) between the gate structures (1505).

Figure 15E:
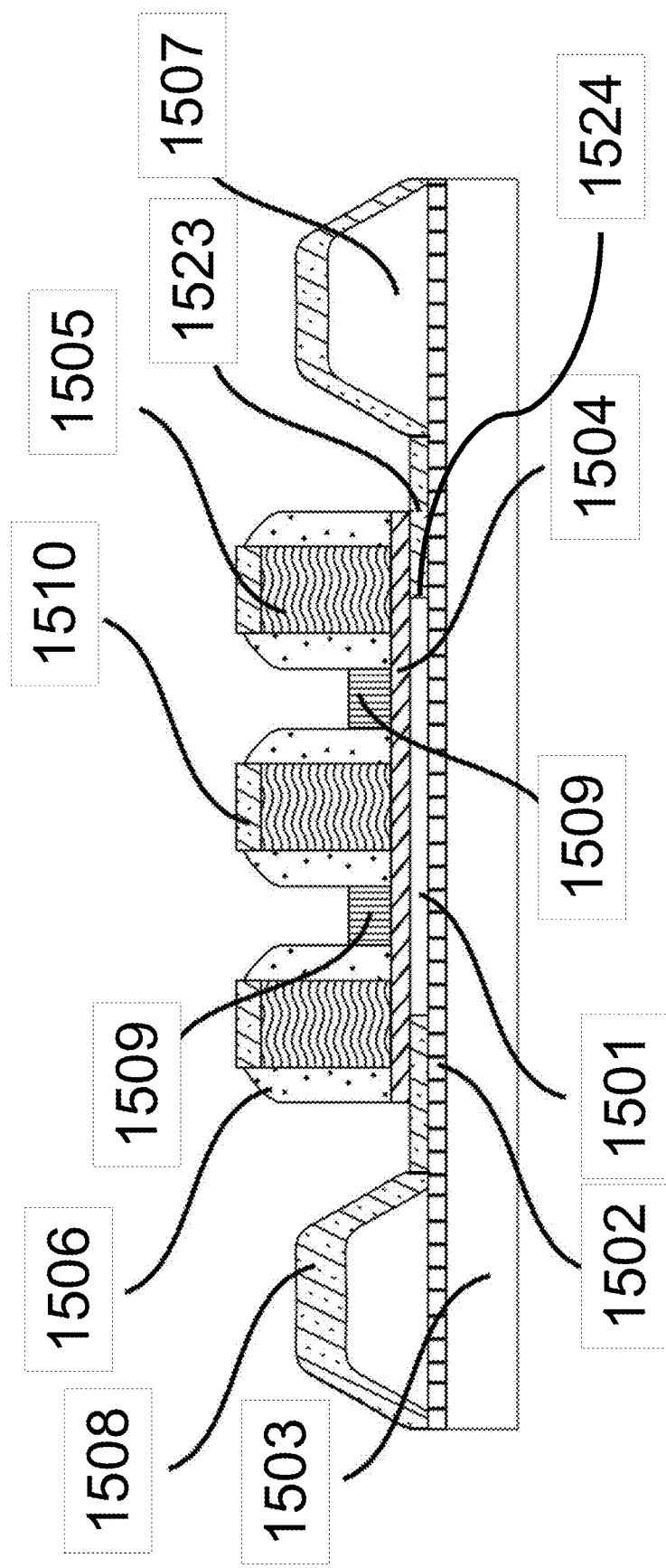
FIG. 15*e*: Cross-section view depicting the final semiconductor device structure as intended by the disclosure.

During one or more subsequent annealing steps, a metal semiconductor alloy (1523) is formed, wherever a direct metal to semiconductor contact (1524) is achieved (FIG. 15e). Most important, the alloy forms directly within the channel region between all raised source or drain areas and their respective gate spacers of the most outer gates. The metal alloy formation is characterized by a lateral diffusion component with respect to the channel direction. A self-limiting formation can be employed to place the semiconductor to alloy interfaces at the desired positions, typically below the gates. The self-limitation can be inducted by either a limited metal source or a low temperature budget anneal. After the process, excess metal is removed by selective etching, removing shorts between sources, drain and multiple independent gate terminals.

FIG. 15e is a cross-section view depicting another example of a semiconductor device structure in accordance with the disclosure. A metal semiconductor alloy (1523) is formed in the vicinity of the two outer gate terminals directly at the semiconductor channel region (1501), as well as on top (1508) of the adjacent raised source and drain regions (1507), but not in between two neighbouring gate terminals due to dielectric protection layer in between the gates (1509). Utilizing this structure, the exact position of the metal semiconductor alloy below the gate terminal can be adjusted with a reduced variability. In this embodiment, a metal semiconductor alloy (1510) is also formed on top of the gate metal stacks (1505) ensuring an electrical connecting to other circuits.

In accordance with the present disclosure, the metal to semiconductor contacts for reconfigurable field effect transistors being carried out at the channel ends as own source or drain contact of Schottky barrier type position under the appropriate gates (FIG. 15e). For such devices the annealing step forming the metal to semiconductor is controlled e.g. by time or by available material such that the contact of Schottky barrier type is positioned under the appropriate gate terminal adjacent to the raised source or drain contact.

In another example, the metal to semiconductor contacts for junctionless field effect transistors are carried out at the channel ends as own source or drain contact not positioned under the appropriate gates. For such devices the annealing step forming the metal to semiconductor contact is controlled e.g. by time or by available material such that the contact of Schottky barrier type is positioned between the raised source or drain contact and the appropriate gate terminal adjacent to the raised source or drain contact e.g. under the spacer between the raised source or drain contact and the gate terminal.

Parallel by forming the metal to semiconductor contacts an alloy formation of the upper part or the whole raised source and drain contact can be conducted. In one embodiment of the disclosure especially if the material of the gate contact (1505) is of the same type as the material selected for the raised source and drain areas (1507) and if the block mask (1509) is removed completely above the gate contact material the upper part (1510) or the whole gate contact material is forming an alloy e.g. in case of Silicon it is silicide. In another embodiment no alloy is formed on top of the gate contact material (1505), especially if the gate contact material (1505) is still covered, e.g. by the block mask material, or it is made of a material not forming an alloy with the metal layer deposited (1511).

In a following step, if the metal layer (1511) is just partially alloyed, the metal not used for alloying is removed by a selective wet etch or by dry etching such that the alloyed channel area is not removed still forming an electrical connection between the channel (1501) and the top of the raised source and drain areas (1508). In another embodiment the metal layer left will be removed by a wet or dry etch partially such that raised source, drain and gate terminal are electrically separated. Residuals of the metal film will stay as long as no electrical connection appears between source contacts, drain contacts and gate terminals.

In another example in more details especially processing an unequal number of gate terminals as needed devices described by the disclosure exemplified by the drawings FIGS. 15a to 15e, a semiconductor on insulator substrate is used, by means that the body of the semiconductor substrate (1503) is isolated by a buried oxide (1502) from the not-yet-structured semiconductor channel (1501). In this example, a single straight sub-channel is patterned as channel region (FIG. 15a). The channel region can be of undoped Silicon in the case of a Schottky barrier device being formed, or of doped Silicon in case of a junctionless device. Doping can be achieved by e.g. Boron, Arsenic of Phosphorus and of a concentration depending of the needs of the device to be performed as described by this disclosure.

An anisotropic etching process, such as reactive ion etching can be used to structure the lithographically defined channel region. Subsequently an atomic layer deposition process of a dielectric material (1504) with a high k-value such as $HfO_2$ is used to form the homogenous conformal gate dielectric. Prior to this step, a $SiO_2$ interface between the dielectric and the silicon channel can be formed, e.g. by a rapid thermal annealing, in order to achieve a defect free channel surface. Three individual top gate contacts (1505) are patterned by a gate-first self-aligned double patterning process where the lateral features of a metal liner are transferred via an anisotropic etch towards the gate contact (1505). The etch-stop on the high-k material can be realized by a sacrificial nitride liner covering the whole high-k material. Gate spacers (1506) are formed via an isotropic silicon nitride deposition followed by an anisotropic etching process. Subsequently a self-aligned $SiO_2$ block spacer (1508) is deposited covering all gates as well as the area between individual gates (FIG. 15b). The gate dielectric material not covered by the block spacer is removed by a wet or dry etch as described before and raised source and drain contacts (1507) are epitaxial grown from the opened channel surface. Preferably, the block spacer is used in a way, that the raised source and drain contacts are locally separated from the gate spacers of the most outer gates (FIG. 15c).

A subsequent isotropic wet etch is used to remove the block spacer above the channel in the area between the source and drain region and the most outer gates. Thereby, the spacer is not etched away completely between the individual gates (1509), thus protecting the high-k to channel interface within the ungated region between the individual gates. Further processing is as described before in FIGS. 15d and 15e.

In another example of the present disclosure, the semiconductor channel is made of a silicon on insulator substrate with 6 nm of highly doped silicon (1501) atop 20 nm buried silicon dioxide (1502) atop a bulk silicon substrate (1503) (FIG. 15a). After a cleaning step 1 nm $SiO_2$ interface is grown and 4 nm of $HfO_2$ and a 1 nm silicon nitride liner are deposited, which all together serve as gate oxide or dielectric layer (1504). 20 nm wide TiN and poly silicon gate contacts (1505) are pattered via reactive ion etching with 20 nm spacing between the individual gate contacts, followed by the self-aligned formation of 5 nm thick silicon nitride spacers (1506). A $SiO_2$ block spacer (1509) is used to fill the space between two individual gates, protecting the ungated area from etching as well as contact filling and silicidation (FIG. 15b).

At the most outer gates the $SiO_2$ block spacer (1509) will reach 10 nm wide over the $Si_3N_4$ gate spacer (1506). After $HfO_2$ and $SiO_2$ dielectric is removed from the fraction of the channel above the source and drain area by reactive ion etching 25 nm thick raised source and drain areas (1507) are grown epitaxial (FIG. 15b). This way the epitaxial grown source and drain regions are locally separated from the gate spacer of the most outer gates. Subsequently, the $SiO_2$ block spacer (1509) is removed by an isotropic wet etch in a way that the ungated channel area between the raised epitaxial areas and the most outer gates is uncovered, while the ungated channel area between the individual gates is still protected (FIG. 15c). Further processing is as described before in FIGS. 15d and 15e.

In another specific embodiment of this disclosure the conductive material and the gate dielectric material of all gate structures is removed after the metal-alloy formation. After removal of the conductive material and the gate dielectric material a new dielectric material and new conductive material is deposited and structured with methods known in the art to form a gate contact with improved materials as before.

Figure 16:
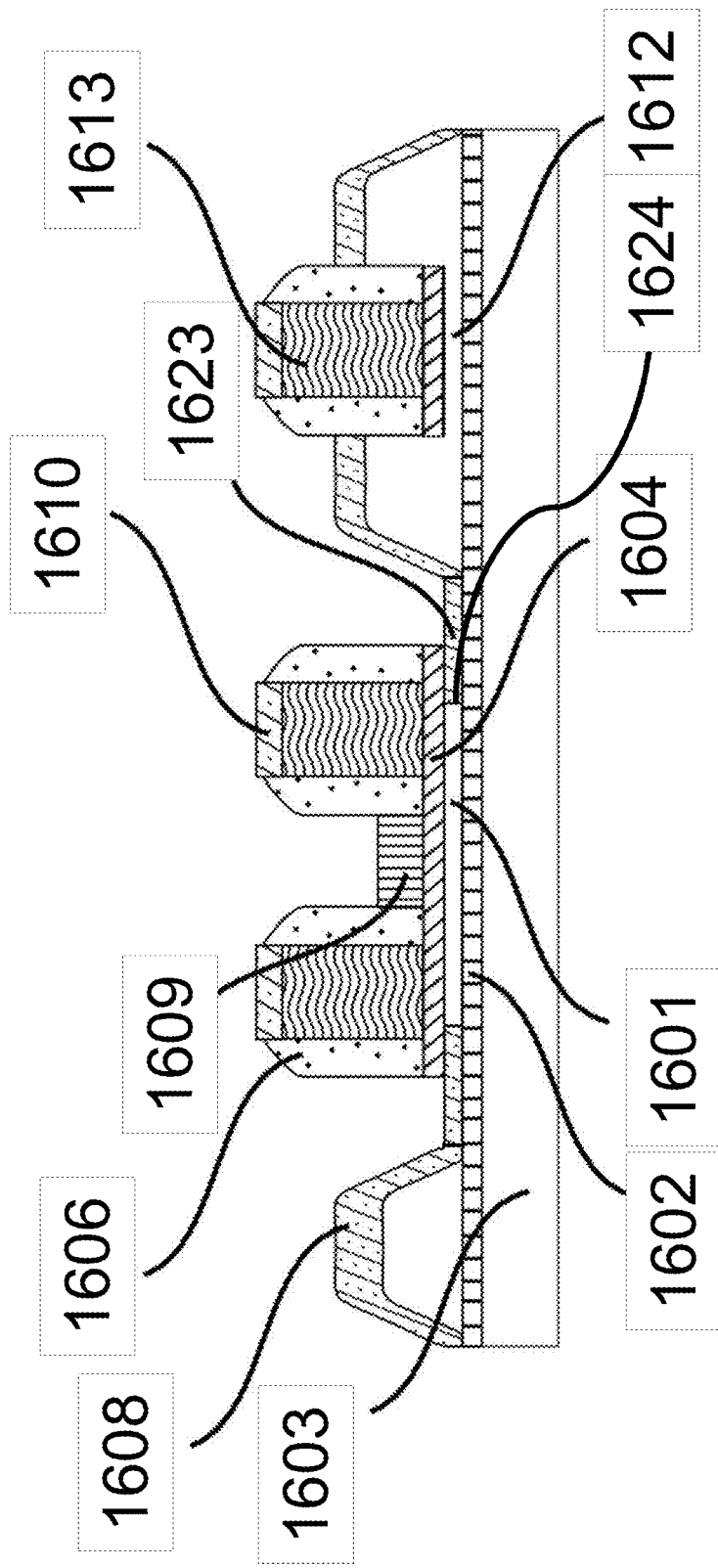
FIG. 16: An example of the structure shown in FIG. 15*e*, where the semiconductor device structure in accordance with this disclosure comprises two gate terminals. One raised source or drain contact of the semiconductor device is shared with an adjacent conventional MOSFET channel (1612).

FIG. 16 depicts another embodiment of the structure shown in FIG. 15e, where the semiconductor device comprising of exactly two gates, where the two gates are the referred outer gates. The source and drain contacts (1624) between the channel (1601) and a metal semiconductor alloy (1623) are formed in the vicinity of the two outer gate terminals. The alloy is formed as well as on the adjacent raised source and drain contacts (1608), but not in between two neighbouring gate terminals due to dielectric protection layer in between the gates (1609). In this embodiment, one raised source or drain area of the semiconductor device is shared with an adjacent conventional MOSFET channel (1612) with adjacent source and drain contacts and an own MOSFET gate (1613). Utilizing this structure, a direct integration into a standard CMOS circuit is possible.

Figure 17:
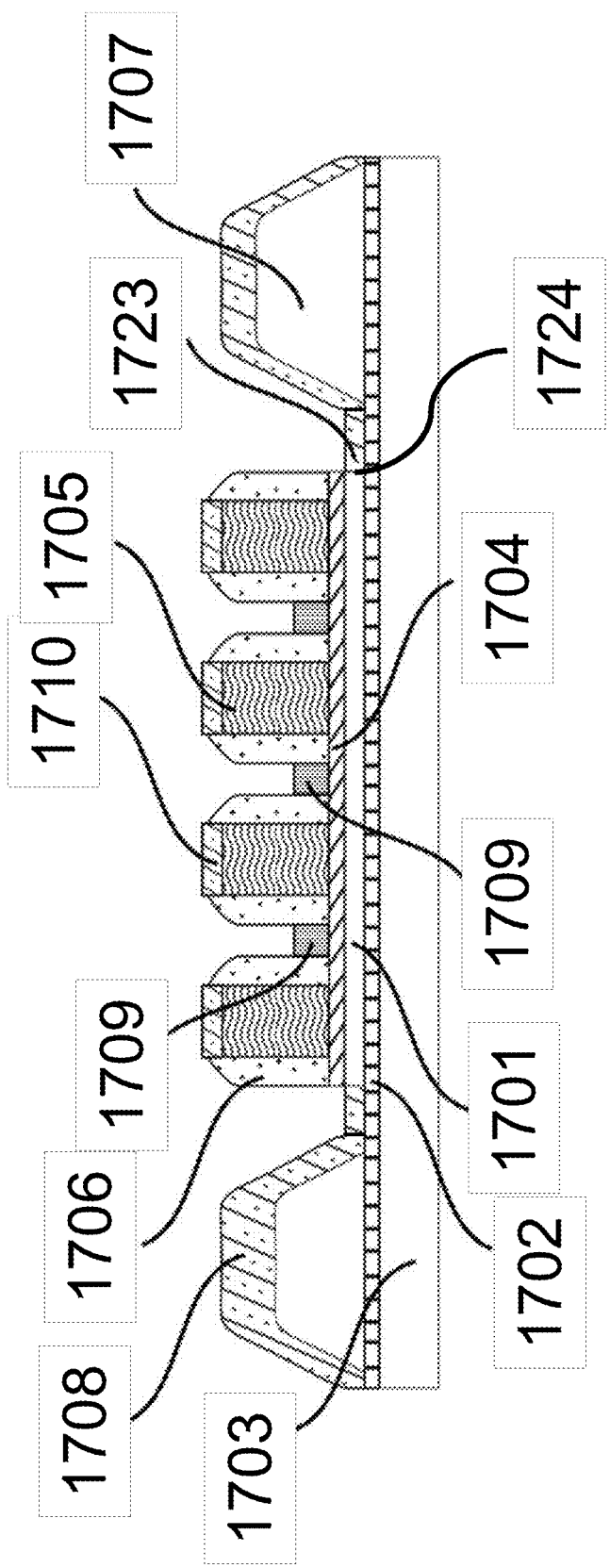
FIG. 17: Cross-sectional view depicting another example of the semiconductor device structure with four gate terminals in accordance with this disclosure for the formation of a junctionless or normally off-transistor with a highly doped-channel.

FIG. 17 is a cross-sectional view depicting another embodiment of the final semiconductor device structure as intended by the disclosure. Four individual gate contacts (1705) are used on a single straight sub-channel as semiconductor region (1701). A metal semiconductor alloy (1723) is formed in the vicinity of the two outer gate terminals, but not extending directly below the outer gate structures forming Ohmic contacts (1724) at the channel (1701) ends. With this embodiment a normally-on transistors with four independent gates is realised. Obviously the process description is not limited to the number of four gate terminals.

A metal semiconductor alloy (1708) is formed as well as on top of the adjacent raised source and drain contacts (1707), but not in between two neighbouring spacers (1706) of the gate terminals due to dielectric protection layer in between the gates (1709). Again, this structure can be utilized to tailor the exact position of the metal alloy to semiconductor contact (1724) with a reduced variability. In this embodiment, a metal semiconductor alloy (1710) is also formed on top of the gate metal stack (1705).

The particular embodiments disclosed above are illustrative only. The disclosure may be modified and practiced in manners apparent different but equivalent to those skilled in the art. For example, the process steps set forth above may be performed in a different order.

What is claimed is:

1. An integrated circuit comprising:
a transistor including:
a semiconductor channel including:
three or more sub-channels, each sub-channel having a pair of ends;
one or more nodes, with each node being a location at which ends of at least three sub-channels join together to form an electrically continuous connection; and
a plurality of channel ends, each channel end being an end of a sub-channel which is separate from a node;
a Schottky contact at each channel end to form a source contact or a drain contact; and
a plurality of first gate contacts, each first gate contact disposed at a corresponding Schottky contact to control a barrier conductivity of the corresponding Schottky contact.

2. The integrated circuit of claim 1, including a number of second gate contacts, where at least one second gate contact is positioned along at least one sub-channel separate from a Schottky contact and separate from a node, each of the second gate contacts to control a conductivity of the corresponding sub-channel.

3. An integrated circuit comprising:
a transistor including:
a semiconductor channel including:
at least three sub-channels, each sub-channel having a pair of ends;
at least one node, the at least one node being a location at which ends of at least three sub-channels join together to form an electrically continuous connection; and
channel ends, each channel end being an end of a sub-channel separate from a node;
an Ohmic contact at each channel end; and
at least one gate contact disposed along at least one of the sub-channels to control a conductivity of the at least one sub-channel.

4. The integrated circuit of claim 3, the transistor including a plurality of gate contacts positioned along a sub-channel to control the conductivity of the sub-channel.

5. The integrated circuit of claim 3, the transistor including a plurality of gate contacts positioned along the sub-channels to control the conductivity of the sub-channels.

6. The integrated circuit of claim 3, wherein a channel end comprises a termination of a sub-channel end at one of a source contract and a drain contact.

7. An integrated circuit comprising:
a semiconductor transistor including:
a semiconductor channel having channel ends;
an isolating dielectric material disposed over the semiconductor channel;
a plurality of gate electrodes disposed over the isolating dielectric material above the semiconductor channel, the plurality of gate electrodes including a plurality of outer-most gate electrodes and at least one middle gate electrode, each outer-most gate electrode disposed at a corresponding channel end and each middle gate electrode disposed between the outer-most gate electrodes, each gate electrode separated from one another by a dielectric spacer material;
a raised semiconductor areas disposed beyond each outer-most gate electrode relative to the corresponding channel end to form one of a drain contact and a source contact, with areas between gate electrodes of the plurality of gate electrodes being free of raised semiconductor areas;
a conductive material extending between each raised semiconductor area to a corresponding channel end to form a Schottky barrier contact below the corresponding outer-most gate electrode such that only a single Schottky barrier contact is formed below each outer-most gate electrode; and
each middle gate electrode surrounded by a dielectric to provide electrical isolation from immediately adjacent gate electrodes of the plurality of gate electrodes, such that the areas between gate electrodes of the plurality of gate electrodes are free from source contacts and drain contacts.

8. The integrated circuit of claim 7, where the conductive material comprises a metal alloy.

9. An integrated circuit comprising a semiconductor transistor including:
a semiconductor channel having channel ends;
an isolating dielectric material disposed over the semiconductor channel;
a plurality of gate electrodes disposed over the isolating dielectric material above the semiconductor channel, each gate electrode separated from one another by a dielectric spacer material;
raised semiconductor areas disposed beyond outer-most gate electrodes relative to the channel ends; and
a conductive material extending between each raised semiconductor area to a corresponding channel end to form an Ohmic contact.

10. The integrated circuit of claim 9, where the conductive material comprises a metal alloy.

11. A method of forming a semiconductor transistor structure comprising:
disposing a transistor dielectric material on a semiconductor channel material;
forming a series of gate structures of a conducting material surrounded by a dielectric spacer material on the transistor dielectric material;
depositing a masking material to mask the gate structures and defined areas adjacent to the gate structure and to fill the space between individual gate structures of the series of gate structures to protect ungated areas from etching;
removing the transistor dielectric material in areas beyond the outermost gate structures not covered by the masking material;
forming by epitaxial growth raised areas on the semiconductor channel material beyond the outermost gate structures where the transistor dielectric material has been removed;
removing the masking material except for portions between the individual gate structures of the series of gate structures;
depositing electrically conductive material layer over the transistor structure; and
forming a metal semiconductor alloy on the epitaxial grown raised areas on the semiconductor channel and portions of the semiconductor channel material via annealing steps.

12. The method of claim 11, wherein the metal semiconductor alloy is formed of the semiconductor channel material under outermost gate structures forming Schottky contacts.

13. The method of claim 11, where the metal semiconductor alloy is formed of the channel material at channel ends proximate outermost gate structures forming Ohmic contacts.

14. The method of claim 11, including:
removing the electrically conductive material and the transistor dielectric material of all gate structures after the metal semiconductor alloy formation followed by deposition of a dielectric material and a conductive material.

* * * * *

UNITED STATES PATENT AND TRADEMARK OFFICE
CERTIFICATE OF CORRECTION

| | | |
|---|---|---|
| PATENT NO. | : 11,515,428 B2 | Page 1 of 1 |
| APPLICATION NO. | : 17/132264 | |
| DATED | : November 29, 2022 | |
| INVENTOR(S) | : Simon et al. | |

It is certified that error appears in the above-identified patent and that said Letters Patent is hereby corrected as shown below:

On the Title Page

Column 1 Insert:
--(30) Foreign Application Priority Data
Dec. 30, 2019 (DE) ............... 10 2019 009 096.9--

Signed and Sealed this
Twenty-eighth Day of February, 2023

Katherine Kelly Vidal
*Director of the United States Patent and Trademark Office*